(12) United States Patent
Tanaka et al.

(10) Patent No.: US 11,784,203 B2
(45) Date of Patent: Oct. 10, 2023

(54) SOLID-STATE IMAGING DEVICE, METHOD FOR MANUFACTURING SOLID-STATE IMAGING DEVICE AND ELECTRONIC APPARATUS HAVING A MULTI-PIXEL HAVING A BACK SIDE SEPARATING PART

(71) Applicant: BRILLNICS SINGAPORE PTE. LTD., Singapore (SG)

(72) Inventors: Shunsuke Tanaka, Tokyo (JP); Saswatee Banerjee, Tokyo (JP)

(73) Assignee: BRILLNICS SINGAPORE PTE. LTD., Singapore (SG)

( * ) Notice: Subject to any disclaimer, the term of this patent is extended or adjusted under 35 U.S.C. 154(b) by 41 days.

(21) Appl. No.: 16/911,266

(22) Filed: Jun. 24, 2020

(65) Prior Publication Data

US 2020/0411578 A1 Dec. 31, 2020

(30) Foreign Application Priority Data

Jun. 25, 2019 (JP) .................................. 2019-117321

(51) Int. Cl.
*H01L 27/146* (2006.01)
(52) U.S. Cl.
CPC .... *H01L 27/14627* (2013.01); *H01L 27/1463* (2013.01); *H01L 27/1464* (2013.01); *H01L 27/14623* (2013.01); *H01L 27/14685* (2013.01); *H01L 27/14621* (2013.01); *H01L 27/14645* (2013.01); *H01L 27/14649* (2013.01)
(58) Field of Classification Search
CPC ........... H01L 27/14623; H01L 27/1463; H01L 27/14627; H01L 27/1464; H01L 27/14685; H01L 27/14621; H01L 27/14645; H01L 27/14649
See application file for complete search history.

(56) References Cited

U.S. PATENT DOCUMENTS

2020/0235142 A1* 7/2020 Saito ................. H01L 27/14605
2022/0165770 A1* 5/2022 Ogasahara ........ H01L 27/14621

FOREIGN PATENT DOCUMENTS

JP 2017139286 A 8/2017

* cited by examiner

*Primary Examiner* — Nelson Garces
(74) *Attorney, Agent, or Firm* — PILLSBURY WINTHROP SHAW PITTMAN LLP

(57) ABSTRACT

Provided are a solid-state imaging device, a method for manufacturing a solid-state imaging device and an electronic apparatus that produce little crosstalk between adjacent sub-pixels, can reduce the influence of the luminance shading, and can even prevent degradation in the sensitivity at the optical center. A multi-pixel includes a back-side separating part separating a plurality of adjacent sub-pixels from each other, and a lens part including a single microlens allowing light to enter photoelectric converting regions of sub-pixels. Here, the optical center of the microlens is positioned on the location where the back side separating part is formed, and the back side separating part is formed such that at least the optical center region thereof exhibits lower reflection than the other region of the back side separating part.

12 Claims, 18 Drawing Sheets

(Related Art)  (Related Art)

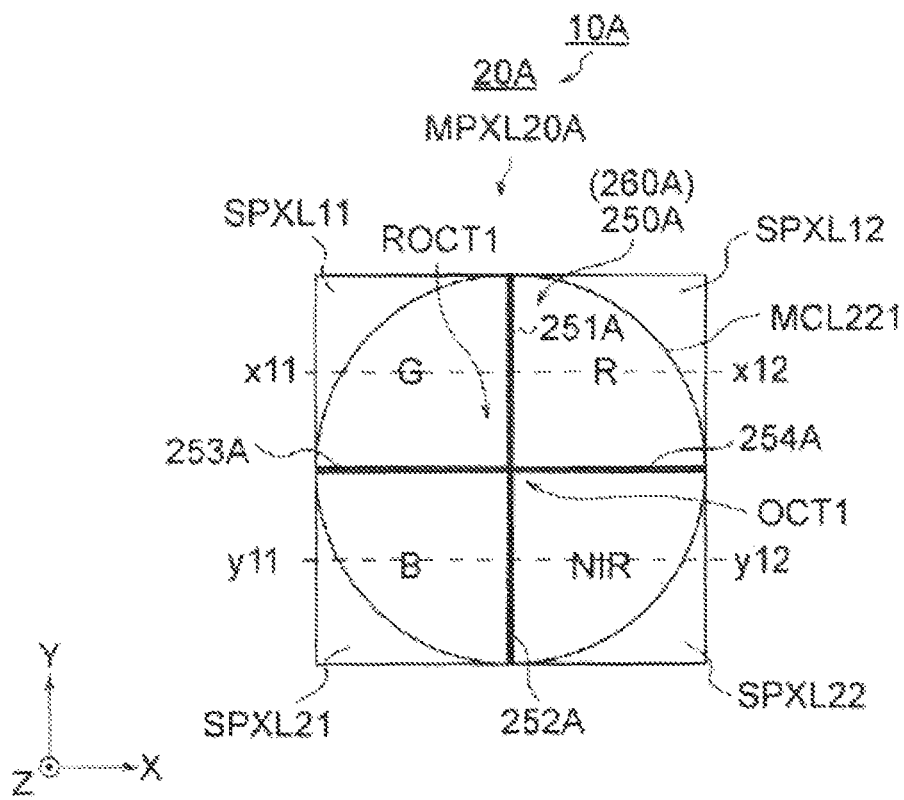
Fig. 9A
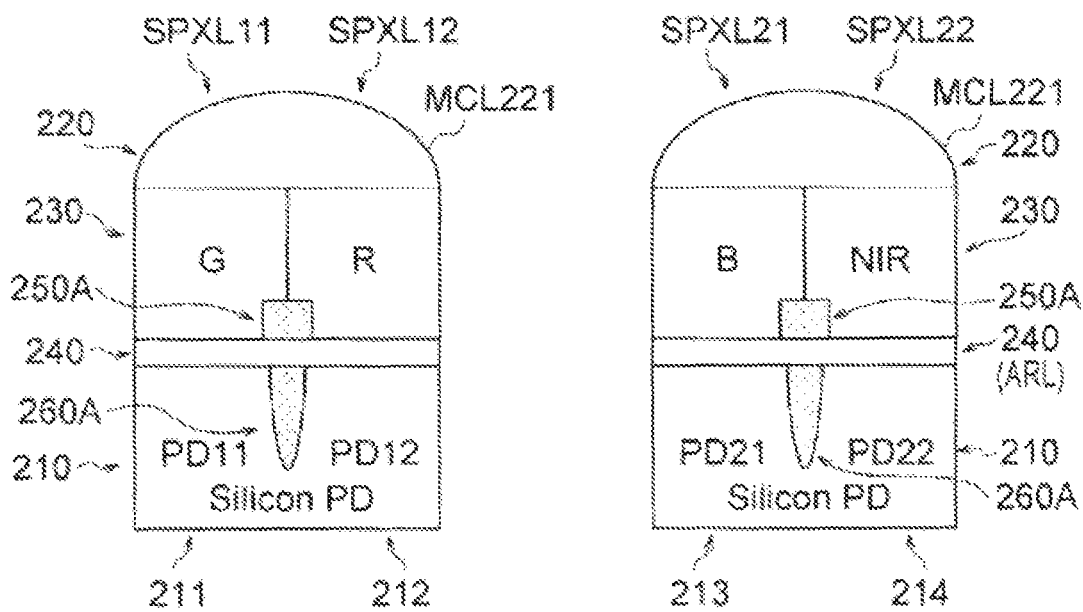
Fig. 9B
Fig. 9C

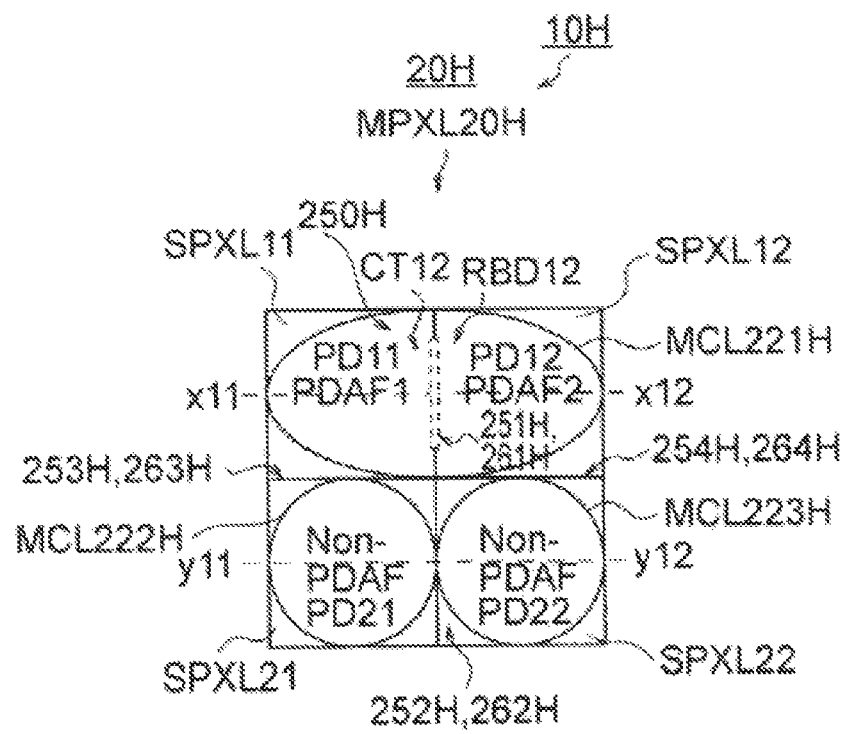
Fig. 14A
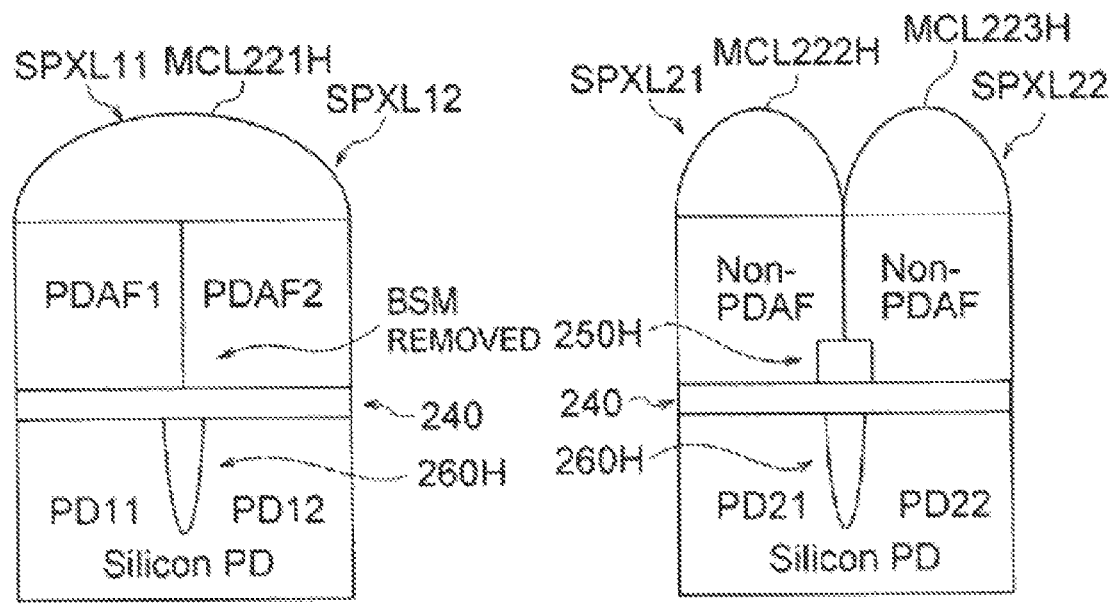
Fig. 14B
Fig. 14C

SOLID-STATE IMAGING DEVICE, METHOD FOR MANUFACTURING SOLID-STATE IMAGING DEVICE AND ELECTRONIC APPARATUS HAVING A MULTI-PIXEL HAVING A BACK SIDE SEPARATING PART

CROSS-REFERENCE TO RELATED APPLICATIONS

This application is based on and claims the benefit of priority from Japanese Patent Application Serial No. 2019-117321 (filed on Jun. 25, 2019), the contents of which are hereby incorporated by reference in their entirety.

TECHNICAL FIELD

The present invention relates to a solid-state imaging device, a method for manufacturing a solid-state imaging device, and an electronic apparatus.

BACKGROUND

Solid-state imaging devices (image sensors) including photoelectric conversion elements for detecting light and generating charges are embodied as CMOS (complementary metal oxide semiconductor) image sensors, which have been in practical use. The CMOS image sensors have been widely applied as parts of various types of electronic apparatuses such as digital cameras, video cameras, surveillance cameras, medical endoscopes, personal computers (PCs), mobile phones and other portable terminals (mobile devices).

A common CMOS image sensor captures color images using three primary color filters for red (R), green (G), and blue (B) or four complementary color filters for cyan, magenta, yellow, and green.

In general, each pixel in a CMOS image sensor has one or more filters. The filters are arranged such that four filters including a red (R) filter that mainly transmits red light, green (Gr, Gb) filters that mainly transmit green light, and a blue (B) filter that mainly transmits blue light are arranged in a square geometry and forms a group of sub-pixels referred to as a unit RGB sub-pixel group or multi-pixel and that the multi-pixels are arranged two-dimensionally.

Light incident on the CMOS image sensor goes through the filters before received by photodiodes. The photodiodes receive light having wavelengths (380 nm to 1,100 nm) within a region wider than the region of wavelengths visible to the human eye (380 nm to approximately 780 nm) and produce signal charges. Therefore, the photodiodes may suffer from errors produced by infrared light and thus have reduced color reproduction quality. Accordingly, it is a general practice to eliminate infrared light previously by infrared cut filters (IR cut filters). However, the IR cut filters attenuate visible light by approximately 10% to 20%, resulting in reduced sensitivity of the solid-state imaging device and degraded image quality.

To overcome this problem, a CMOS image sensor (a solid-state imaging device) can be realized without the use of IR cut filters and has been devised (see, for example, Japanese Patent Application Publication No. 2017-139286). This CMOS image sensor includes sub-pixel groups arranged two-dimensionally, and the sub-pixel groups are unit RGBIR sub-pixel groups or multi-pixels. Each sub-pixel group includes sub-pixels arranged in a square geometry, that is, an R sub-pixel including a red (R) filter that mainly transmits red light, a G sub-pixel including a green (G) filter that mainly transmits green light, a B sub-pixel including a blue (B) filter that mainly transmits blue light, and one of a near-infrared (NIR, for example, 850 nm, 940 nm) dedicated sub-pixel that receives infrared light and a monochrome infrared (M-NIR, for example, 500 nm to 955 nm) sub-pixel that receives monochrome (M) light and infrared light. When the NIR sub-pixel is present, the filter can cut off IR at a selected wavelength or pass IR within a predetermined wavelength range. When configured to cut off the IR, the filter blocks light of the designated wavelength from entering the image sensor. When configured to pass the IR, the filter passes only the IR light within the selected wavelength range. Every sub-pixel in the multi-pixel can have one or more on-chip color filter layers. For example, a sub-pixel can have a double-layered color filter structure formed by combining together an NIR filter that cuts off or passes the IR at a specific wavelength or within a specific wavelength range and an R, G or B layer. This CMOS image sensor operates as a NIR-RGB sensor that can capture so-called NIR images and RGB images.

In this CMOS image sensor, output signals from sub-pixels receiving infrared light are used to correct output signals from sub-pixels receiving red, green, and blue light, thereby achieving high color reproducibility without the use of IR cut filters.

Further, there has been known an infrared (IR, NIR) sensor in which the four sub-pixels in a unit sub-pixel group or multi-pixel are replaced with one NIR pixel having a larger pixel size and dedicated to receive NIR.

FIGS. 1A to 1C schematically show a first example configuration of a solid-state imaging device (a CMOS image sensor) having a microlens for each sub-pixel. FIG. 1A is a plan view schematically showing an example arrangement of constituents of a solid-state imaging device (a CMOS image sensor) formed as an NIR-RGB sensor. FIG. 1B is a simplified sectional view along the line x1-x2 in FIG. 1A. FIG. 1C is a simplified sectional view along the line y1-y2 in FIG. 1A.

In the solid-state imaging device 1 shown in FIGS. 1A to 1C, a multi-pixel MPXL1 is constructed such that a G sub-pixel SPXLG with a green (G) filter FLT-G that mainly transmits green light, an R sub-pixel SPXLR with a red (R) filter FLT-R that mainly transmits red light, a B sub-pixel SPXLB with a blue (B) filter FLT-B that mainly transmits blue light and a dedicated near-infrared (NIR) sub-pixel SPXLNI that receives infrared light are arranged in two rows and two columns in a square geometry.

In the multi-pixel MPXL1, an anti-reflective film ARL is formed between the light entering surface of photoelectric converting region PD (1-4) and the light exiting surface of the filters. The light entering portion of the photoelectric converting region PD of the multi-pixel MPXL1 is divided (segmented) into a first photoelectric converting region PD1, a second photoelectric converting region PD2, a third photoelectric converting region PD3 and a fourth photoelectric converting region PD4, which respectively correspond to the sub-pixels SPXLG, SPXLR, SPXLB, SPXLNI. More specifically, the light entering portion of the photoelectric converting region PD is divided into four portions by a back side metal (BSM), which serves as a back-side separating part. In the example shown in FIGS. 1A to 1C, the back side metal BSM is formed at the boundaries between the sub-pixels SPXLG, SPXLR, SPXLB, and SPXLNI such that the back side metal BCM protrudes from the anti-reflective film ARL into the filters. Additionally, in the photoelectric converting region PD, a back side deep trench isolation (BDTI) is formed as a trench-shaped back side separation such that the BDTI is aligned with the back side metal (BSM) in the depth direction of the photoelectric converting region PD. In this way, the sub-pixel SPXLG includes the first photoelectric converting region PD1, the sub-pixel SPXLR includes the second photoelectric converting region PD2, the sub-pixel SPXLB include the third photoelectric converting region PD3, and the sub-pixel SPXLNI includes the fourth photoelectric converting region PD4.

In the solid-state imaging device 1, the sub-pixel regions have, at the light entering side of the filter, corresponding microlenses MCL1, MCL2, MCL3 and MCL4. The microlens MCL1 allows light to enter the first photoelectric converting region PD1 of the sub-pixel SPXLG, the microlens MCL2 allows light to enter the second photoelectric converting region PD2 of the sub-pixel SPXLR, the microlens MCL3 allows light to enter the third photoelectric converting region PD3 of the sub-pixel SPXLB, and the microlens MCL4 allows light to enter into the fourth photoelectric converting region PD4 of the sub-pixel SPXLNI.

FIGS. 2A and 2B schematically show second and third example configurations of a solid-state imaging device (CMOS image sensor) where each sub-pixel has a microlens. FIG. 2A is a plan view schematically showing an example arrangement of constituents of a solid-state imaging device (a CMOS image sensor) formed as an RGB sensor. FIG. 2B is a plan view schematically showing an example arrangement of constituents of a solid-state imaging device (a CMOS image sensor) formed as an M-NIR sensor.

When a multi-pixel MPXL1A of a solid-state imaging device 1A shown in FIG. 2A is compared with the multi-pixel MPXL1 of FIGS. 1A to 1C, the near infrared (NIR) sub-pixel SPXLNI is replaced with a G sub-pixel SPXLG.

In a multi-pixel MPXL1B of a solid-state imaging device 1B shown in FIG. 2B, the G sub-pixel SPXLG and the R sub-pixel SPCLR in the same row are replaced with an M sub-pixel SPXLM and a single microlens MCL5. The B sub-pixel SPXLB is replaced with an NIR sub-pixel SPXLNI covering two sub-pixel regions and with a single microlens MCL6.

FIGS. 3A to 3C schematically show a fourth example configuration of a solid-state imaging device (a CMOS image sensor) in which one microlens is shared between a plurality of sub-pixels. FIG. 3A is a plan view schematically showing an example arrangement of constituents of a solid-state imaging device (a CMOS image sensor) formed as an NIR-RGB sensor. FIG. 3B is a simplified sectional view along the line x1-x2 in FIG. 3A. FIG. 3C is a simplified sectional view along the line y1-y2 in FIG. 3A.

In a multi-pixel MPXL1C of a solid-state imaging device 1C shown in FIG. 3A, four sub-pixels SPXLG, SPXLR, SPXLB and SPXLNI that are arranged in a square geometry of 2×2 share a single microlens MCL7.

FIGS. 4A and 4B schematically show fifth and sixth example configurations of a solid-state imaging device (a CMOS image sensor) in which a plurality of sub-pixels share a single microlens. FIG. 4A is a plan view schematically showing an example arrangement of constituents of a solid-state imaging device (a CMOS image sensor) formed as an RGB sensor. FIG. 4B is a plan view schematically showing as an example arrangement of constituents of a solid-state imaging device (a CMOS image sensor) formed as an M-NIR sensor.

In a multi-pixel MPXL1D of a solid-state imaging device 1D shown in FIG. 4A, four sub-pixels SPXLG, SPXLR, SPXLB and SPXLG that are arranged in a square geometry of 2×2 share a single microlens MCL8.

In a multi-pixel MPXL1E of a solid-state imaging device 1E shown in FIG. 4B, two sub-pixels SPXLM and SPXLNI share a single microlens MCL9.

The solid-state imaging devices (CMOS image sensors) where each sub-pixel has a microlens, as shown in FIGS. 1A to 1C and FIGS. 2A and 2B, have the following advantages and disadvantages.

<Advantages>

Little crosstalk occurs between adjacent sub-pixels. Since the optical center of the microlens coincides with the optical center of the photoelectric converting region (photodiode) PD, symmetrical luminance shading can be achieved.

<Disadvantages>

The responsiveness is low due to the gap between different microlenses. As no distance information can be obtained, phase detection auto focus (PDAF) capability can never be provided.

The solid-state imaging devices (CMOS image sensors) shown in FIGS. 3A to 3C and FIGS. 4A and 4B, where a plurality of sub-pixels share a single microlens, have the following advantages and disadvantages.

<Advantages>

Every pixel can have distance information, which can be applied to provide for the PDAF capability.

<Disadvantages>

Since each pixel has a different shading profile, the luminance shading wields a significant impact. As the optical center of the microlens is positioned at the location where the back side metal (BSM) is formed, reflection and the like radically lowers the sensitivity at the optical center.

SUMMARY

One object of the present invention is to provide a solid-state imaging device, a method for manufacturing a solid-state imaging device, and an electronic apparatus that produces little crosstalk between adjacent sub-pixels, can reduce the influence of the luminance shading, and can even prevent the degradation in the sensitivity at the optical center.

A first aspect of the present invention provides a solid-state imaging device including a multi-pixel including at least two sub-pixels, where each sub-pixel has a photoelectric converting region. The multi-pixel includes a back side separating part separating a plurality of adjacent sub-pixels from each other at least in a light entering portion of the photoelectric converting region thereof, and a single lens part allowing light to enter a photoelectric converting region of at least two sub-pixels. The lens part is arranged such that an optical center thereof is positioned at a location where the back side separating part is formed. The back side separating part is formed such that at least an optical center region thereof exhibits lower reflection than the other region of the back side separating part.

A second aspect of the present invention provides a method for manufacturing a solid-state imaging device including a multi-pixel having at least two sub-pixels, where each sub-pixel has a photoelectric converting region. The multi-pixel has a back side separating part separating a plurality of adjacent sub-pixels from each other at least in a light entering portion of the photoelectric converting region thereof, and a single lens part allowing light to enter a photoelectric converting region of at least two sub-pixels. An optical center of the lens part is positioned at a location where the back side separating part is formed. The back side separating part is formed such that at least an optical center region thereof exhibits lower reflection than the other region of the back side separating part.

A third aspect of the present invention provides an electronic apparatus including a solid-state imaging device and an optical system for forming a subject image on the solid-state imaging device. The solid-state imaging device includes a multi-pixel having at least two sub-pixels, where each sub-pixel has a photoelectric converting region. The multi-pixel has a back side separating part separating a plurality of adjacent sub-pixels from each other at least in a light entering portion of the photoelectric converting region and a single lens part allowing light to enter a photoelectric converting region of at least two sub-pixels. The lens part is arranged such that an optical center thereof is positioned at a location where the back side separating part is formed. The back side separating part is formed such that at least an optical center region thereof exhibits lower reflection than the other region of the back side separating part.

Advantageous Effects

The present invention produces little crosstalk between adjacent sub-pixels, can reduce the influence of the luminance shading, and can even prevent the degradation in the sensitivity at the optical center.

BRIEF DESCRIPTION OF THE DRAWINGS

FIGS. 9A to 9C schematically show an example configuration of a solid-state imaging device (a CMOS image sensor) according to a second embodiment of the present invention.

FIGS. 14A to 14C schematically show an example configuration of a solid-state imaging device (a CMOS image sensor) according to a sixth embodiment of the present invention.

DESCRIPTION OF THE PREFERRED EMBODIMENTS

Embodiments of the present invention will be hereinafter described with reference to the drawings.

First Embodiment

Figure 5:
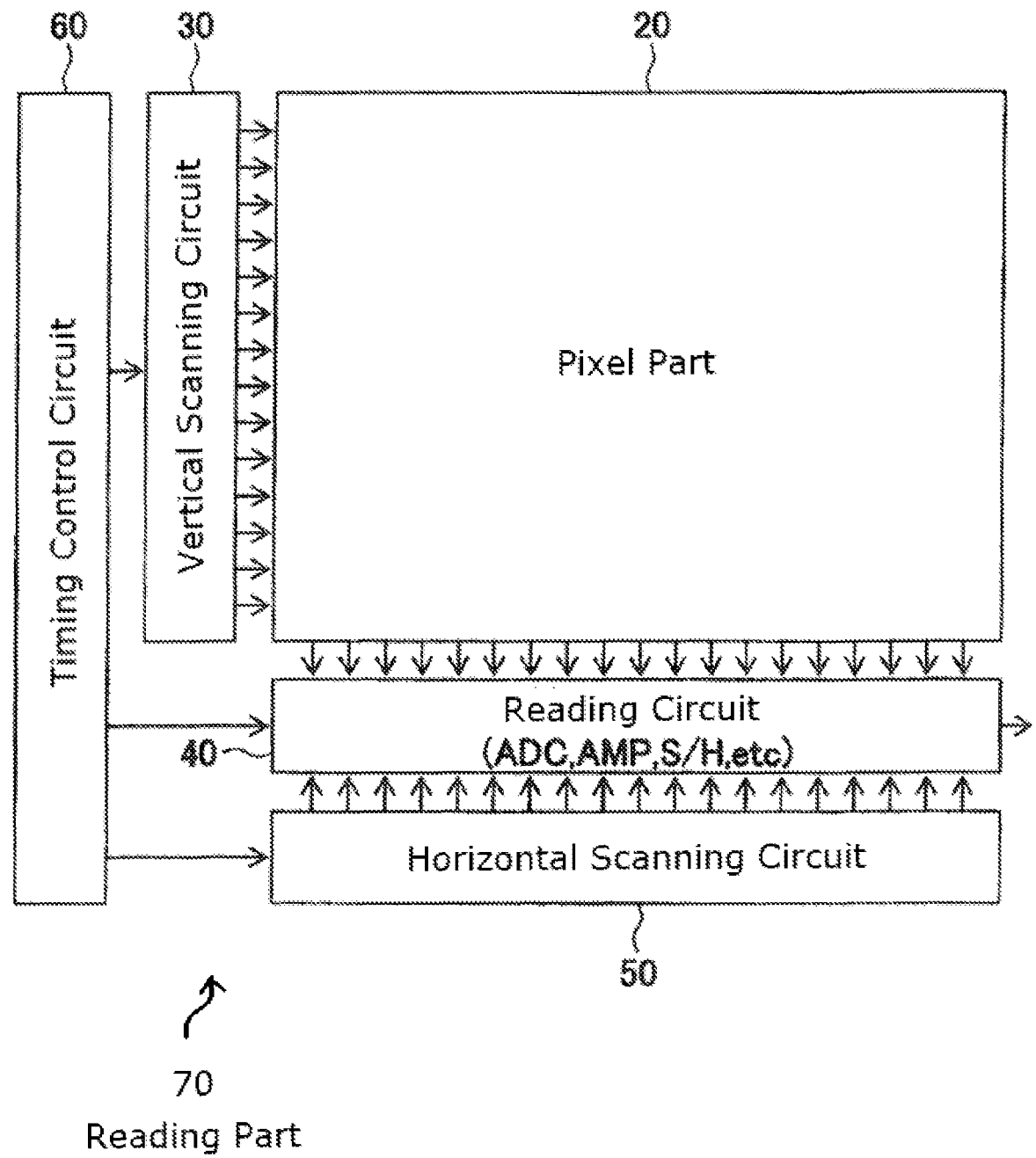
FIG. 5 is a block diagram showing an example configuration of a solid-state imaging device according to a first embodiment of the present invention.

FIG. 5 is a block diagram showing an example configuration of a solid-state imaging device relating to a first embodiment of the present invention. In this embodiment, a solid-state imaging device 10 is constituted by, for example, a CMOS image sensor. The CMOS image sensor is, for example, applied to back-side illumination image sensor (BSI).

As shown in FIG. 5, the solid-state imaging device 10 is constituted mainly by a pixel part 20 serving as an image capturing part, a vertical scanning circuit (a row scanning circuit) 30, a reading circuit (a column reading circuit) 40, a horizontal scanning circuit (a column scanning circuit) 50, and a timing control circuit 60. Among these components, for example, the vertical scanning circuit 30, the reading circuit 40, the horizontal scanning circuit 50, and the timing control circuit 60 constitute the reading part 70 for reading out pixel signals.

In the solid-state imaging device 10 relating to the first embodiment, as will be described in detail below, the pixels arranged in a matrix pattern in the pixel part 20 are each a multi-pixel constituted by at least two (four, in the first embodiment) sub-pixels each having a photoelectric converting region. In the first embodiment, the multi-pixel includes a back side separating part separating a plurality of adjacent sub-pixels from each other at least in a light entering portion of the photoelectric converting region of the multi-pixel and a single lens part allowing light to enter the photoelectric converting regions of at least two sub-pixels. In the first embodiment, the optical center of the lens part is positioned at the location where the back side separating part is formed, and at least the optical center region of the back side separating part exhibits lower reflection (higher absorption) than the other region of the back side separating part. In the first embodiment, the optical center region of the back side separating part exhibits lower reflection (higher absorption) than the other region of the back side separating part.

In the first embodiment, the multi-pixel serves as a unit group of sub-pixels and is configured as an NIR-RGB sensor.

The following briefly describes the configurations and functions of the parts of the solid-state imaging device 10 and then describes in detail the configurations and arrangement of the multi-pixels.

<Configuration of Pixel Part 20 and Multi-Pixel MPXL20>

In the pixel part 20, a plurality of multi-pixels each including a photodiode (a photoelectric conversion part) and an in-pixel amplifier are arranged in a two-dimensional matrix comprised of N rows and M columns.

Figure 6:
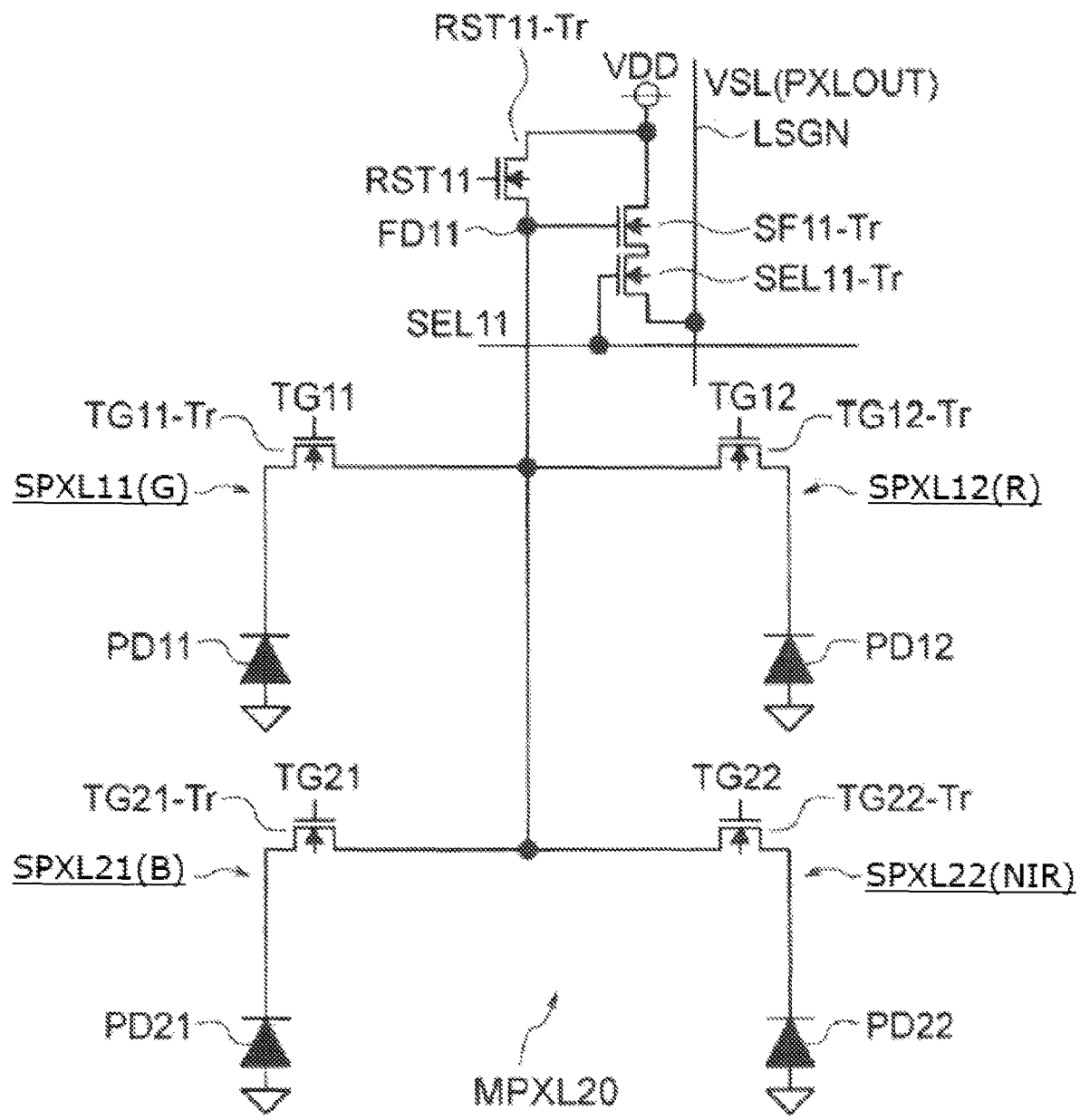
FIG. 6 is a circuit diagram showing an example multi-pixel, where four sub-pixels share a single floating diffusion, in a pixel part of the solid-state imaging device according to the first embodiment of the present invention.

FIG. 6 is a circuit diagram showing an example multi-pixel in which four sub-pixels share a single floating diffusion in the pixel part of the solid-state imaging device relating to the first embodiment of the present invention.

In the pixel part 20 of FIG. 6, a multi-pixel MPXL20 has four sub-pixels, namely, a first sub-pixel SPXL11, a second sub-pixel SPXL12, a third sub-pixel SPXL21, and a fourth sub-pixel SPXL22 arranged in a square geometry of 2×2.

The first sub-pixel SPXL11 includes a photodiode PD11 formed by a first photoelectric converting region and a transfer transistor TG11-Tr.

The second sub-pixel SPXL12 includes a photodiode PD12 formed by a second photoelectric converting region and a transfer transistor TG12-Tr.

The third sub-pixel SPXL21 includes a photodiode PD21 formed by a third photoelectric converting region and a transfer transistor TG21-Tr.

The fourth sub-pixel SPXL22 includes a photodiode PD22 and a transfer transistor TG22-Tr.

In the multi-pixel MPXL20 in the pixel part 20, the four sub-pixels SPXL11, SPXL12, SPXL21 and SPXL22 share a floating diffusion FD11, a reset transistor RST11-Tr, a source follower transistor SF11-Tr, and a selection transistor SEL11-Tr.

In such a 4-sub-pixel sharing configuration, for example, the first sub-pixel SPXL11 is configured as a G sub-pixel, the second sub-pixel SPXL12 is configured as an R sub-pixel, the third sub-pixel SPXL21 is configured as a B sub-pixel and the fourth sub-pixel SPXL22 is configured as an NIR sub-pixel. For example, the photodiode PD11 of the first sub-pixel SPXL11 operates as a first green (G) photoelectric converting part, the photodiode PD12 of the second sub-pixel SPXL12 operates as the red (R) photoelectric converting part, the photodiode PD21 of the third sub-pixel SPXL21 operates as a blue (B) photoelectric converting part, and the photodiode PD22 of the fourth sub-pixel SPXL22 operates as an near infrared (NIR) photoelectric converting part.

The photodiodes PD11, PD12, PD21, PD22 are, for example, pinned photodiodes (PPDs). On the substrate surface for forming the photodiodes PD11, PD12, PD21, PD22, there is a surface level due to dangling bonds or other defects, and therefore, a lot of charges (dark current) are generated due to heat energy, so that a correct signal fails to be read out. In a pinned photodiode (PPD), a charge accumulation part of the photodiode PD can be buried in the substrate to reduce mixing of the dark current into signals.

The photodiodes PD11, PD12, PD21, PD22 generate signal charges (here, electrons) in an amount determined by the quantity of the incident light and store the same. A description will be hereinafter given of a case where the signal charges are electrons and each transistor is an n-type transistor. However, it is also possible that the signal charges are holes or each transistor is a p-type transistor.

The transfer transistor TG11-Tr is connected between the photodiode PD11 and the floating diffusion FD11 and controlled through a control line (or a control signal) TG11. Under control of the reading part 70, the transfer transistor TG11-Tr remains selected and in the conduction state in a period in which the control line TG11 is at a predetermined high (H) level, to transfer charges (electrons) produced by photoelectric conversion and stored in the photodiode PD11 to the floating diffusion FD11.

The transfer transistor TG12-Tr is connected between the photodiode PD12 and the floating diffusion FD11 and controlled through a control line (or a control signal) TG12. Under control of the reading part 70, the transfer transistor TG12-Tr remains selected and in the conduction state in a period in which the control line TG12 is at a predetermined high (H) level, to transfer charges (electrons) produced by photoelectric conversion and stored in the photodiode PD12 to the floating diffusion FD11.

The transfer transistor TG21-Tr is connected between the photodiode PD21 and the floating diffusion FD11 and controlled through a control line (or a control signal) TG21. Under control of the reading part 70, the transfer transistor TG21-Tr remains selected and in the conduction state in a period in which the control line TG21 is at a predetermined high (H) level, to transfer charges (electrons) produced by photoelectric conversion and stored in the photodiode PD21 to the floating diffusion FD11.

The transfer transistor TG22-Tr is connected between the photodiode PD22 and the floating diffusion FD11 and controlled through a control line (or a control signal) TG22. Under control of the reading part 70, the transfer transistor TG22-Tr remains selected and in the conduction state in a period in which the control line TG22 is at a predetermined high (H) level to transfer charges (electrons) produced by photoelectric conversion and stored in the photodiode PD22 to the floating diffusion FD11.

As shown in FIG. 6, the reset transistor RST11-Tr is connected between a power supply line VDD (or a power supply potential) and the floating diffusion FD11 and controlled through a control line (or a control signal) RST11. Alternatively, the reset transistor RST11-Tr may be connected between a power supply line VRst different from the power supply line VDD and the floating diffusion FD and controlled through the control line (or the control signal) RST11. Under control of the reading part 70, during a scanning operation for reading, for example, the reset transistor RST11-Tr remains selected and in the conduction state in a period in which the control line RST11 is at the H level, to reset the floating diffusion FD11 to the potential of the power supply line VDD (or VRst).

The source follower transistor SF11-Tr and the selection transistor SEL11-Tr are connected in series between the power supply line VDD and a vertical signal line LSGN. The floating diffusion FD11 is connected to the gate of the source follower transistor SF11-Tr, and the selection transistor SEL11-Tr is controlled through a control line (or a control signal) SEL11. The selection transistor SEL11-Tr remains selected and in the conduction state in a period in which the control line SEL11 is at the H level. In this way, the source follower transistor SF11-Tr outputs, to the vertical signal line LSGN, a read-out voltage (signal) of a column output VSL (PIXOUT), which is obtained by converting the charges of the floating diffusion FD11 with a gain determined by the quantity of the charges (the potential) into a voltage signal.

The vertical scanning circuit 30 drives the sub-pixels in shutter and read-out rows through the row-scanning control lines under the control of the timing control circuit 60. Furthermore, the vertical scanning circuit 30 outputs, according to address signals, row selection signals for row addresses of the read-out rows from which signals are to be read out and the shutter rows in which the charges accumulated in the photodiodes PD are reset.

In a normal pixel reading operation, the vertical scanning circuit 30 of the reading part 70 drives the pixels to perform shutter scanning and then reading scanning.

The reading circuit 40 includes a plurality of column signal processing circuits (not shown) arranged corresponding to the column outputs of the pixel part 20, and the reading circuit 40 may be configured such that the plurality of column signal processing circuits can perform column parallel processing.

The reading circuit 40 may include a correlated double sampling (CDS) circuit, an analog-to-digital converter (ADC), an amplifier (AMP), a sample/hold (S/H) circuit, and the like.

Figure 7A:
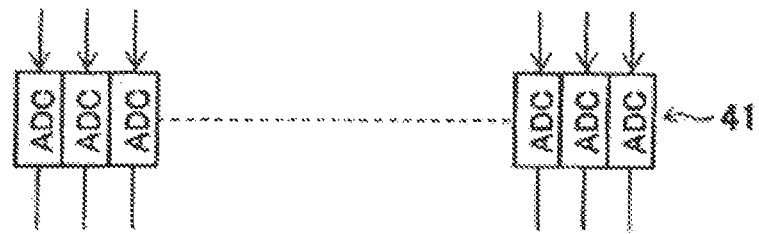
FIGS. 7A to 7C show example configurations of a column signal processing circuit in a reading circuit according to the embodiment.
Figure 7B:
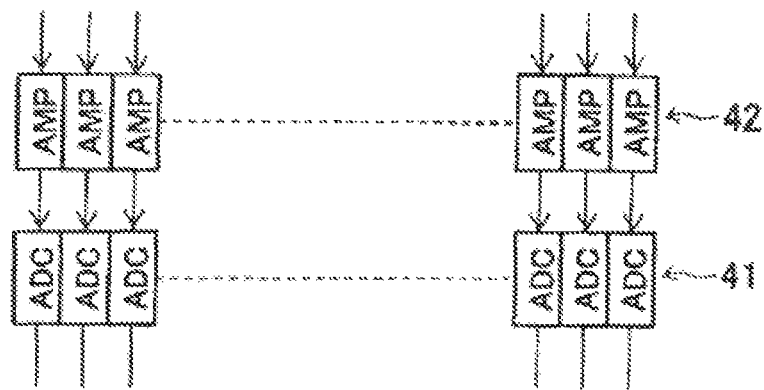
Figure 7C:
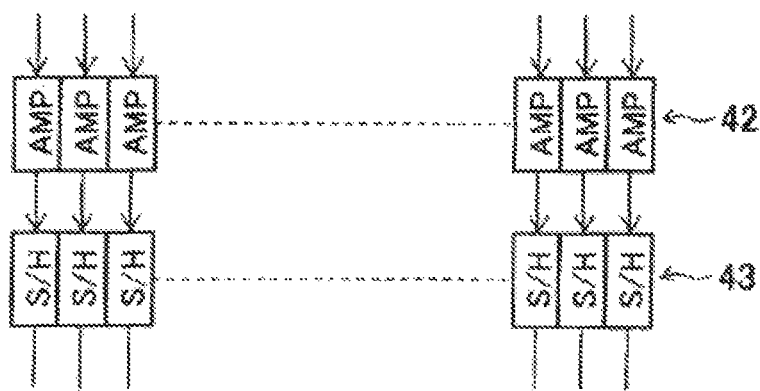

As mentioned above, as shown in FIG. 7A, for example, the reading circuit 40 may include ADCs 41 for converting the read-out signals VSL from the column outputs of the pixel part 20 into digital signals. Alternatively, as shown in FIG. 7B, for example, the reading circuit 40 may include amplifiers (AMPs) 42 for amplifying the read-out signals VSL from the column outputs of the pixel part 20. It is also possible that, as shown in FIG. 7C, for example, the reading circuit 40 may include sample/hold (S/H) circuits 43 for sampling/holding the read-out signals VSL from the column outputs of the pixel part 20.

The horizontal scanning circuit 50 scans the signals processed in the plurality of column signal processing circuits of the reading circuit 40 such as ADCs, transfers the signals in a horizontal direction, and outputs the signals to a signal processing circuit (not shown).

The timing control circuit 60 generates timing signals required for signal processing in the pixel part 20, the vertical scanning circuit 30, the reading circuit 40, the horizontal scanning circuit 50, and the like.

The above description has outlined the configurations and functions of the parts of the solid-state imaging device 10. Next, a description will be given of the specific arrangement of the pixels according to the first embodiment.

Figure 8A:
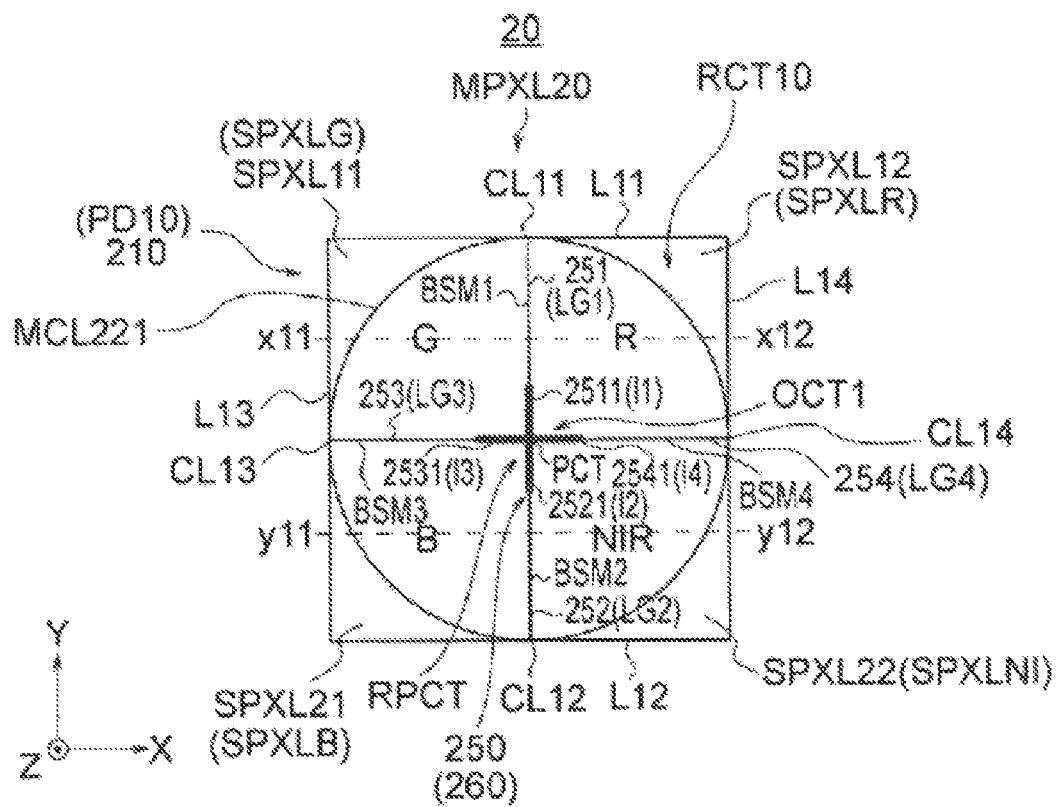
FIGS. 8A to 8C schematically show an example configuration of the solid-state imaging device (the CMOS image sensor) according to the first embodiment of the present invention.
Figures 8B, 8C:
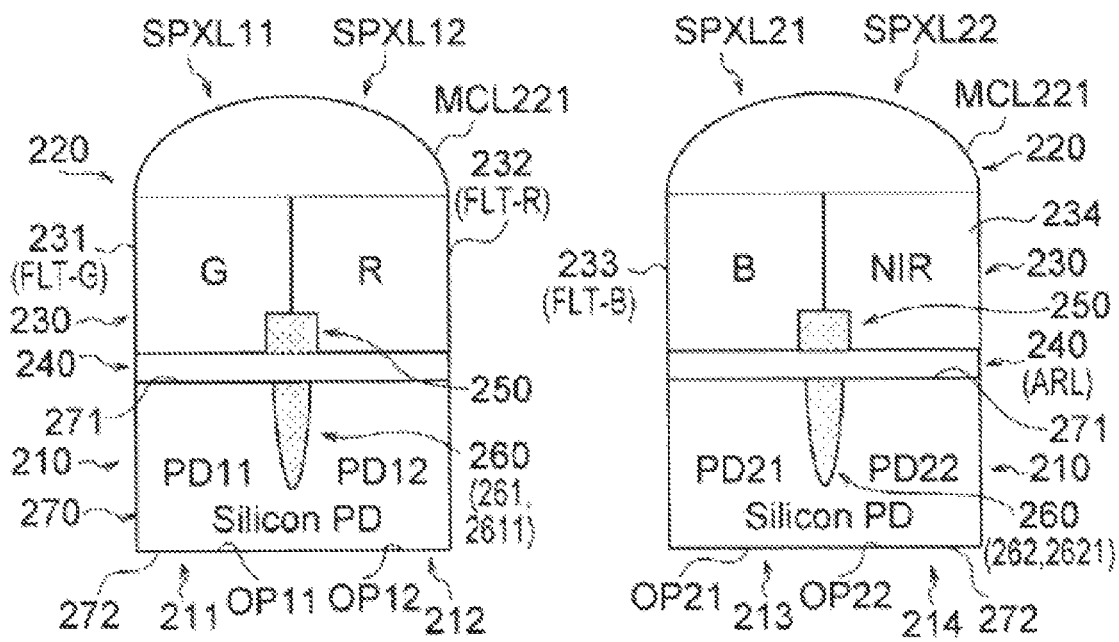

FIGS. 8A to 8C schematically show an example configuration of the solid-state imaging device (the CMOS image sensor) according to the first embodiment of the present invention. FIG. 8A is a plan view schematically showing an example arrangement of the constituents of the solid-state imaging device (the CMOS image sensor), which is formed as an NIR-RGB sensor. FIG. 8B is a simplified sectional view along the line x11-x12 in FIG. 8A. FIG. 8C is a simplified sectional view along the line y11-y12 in FIG. 8A.

In the present embodiment, a first direction refers to the column direction (the horizontal or X direction), row direction (the vertical or Y direction) or diagonal direction of the pixel part 20 in which a plurality of pixels are arranged in a matrix pattern. The following description is made with the first direction referring to the column direction (the horizontal or X direction), for example. Accordingly, a second direction refers to the row direction (the vertical or Y direction).

In the pixel part 20 of FIG. 8A, the multi-pixel MPXL20 has four sub-pixels, namely, a first sub-pixel SPXL11, a second sub-pixel SPXL12, a third sub-pixel SPXL21, and a fourth sub-pixel SPXL22 arranged in a square geometry of 2×2. More specifically, in the multi-pixel MPXL20, the first to fourth sub-pixels SPXL11, SPXL12, SPXL21 and SPXL22 are arranged in a square geometry such that the first sub-pixel SPXL11 is adjacent to the second sub-pixel SPXL12 in the first or X direction, the third sub-pixel SPXL21 is adjacent to the fourth sub-pixel SPXL22 in the first or X direction, the first sub-pixel SPXL11 is adjacent to the third sub-pixel SPXL21 in the second direction orthogonal to the first direction, or the Y direction and the second sub-pixel SPXL12 is adjacent to the fourth sub-pixel SPXL22 in the second or Y direction.

In the first embodiment, the first sub-pixel SPXL11 is configured as a G sub-pixel SPXLG with a green (G) filter FLT-G that mainly transmits green light, the second sub-pixel SPXL12 is configured as an R sub-pixel SPXLR with a red (R) filter FLT-R that mainly transmits red light, the third sub-pixel SPXL21 is configured as a B sub-pixel SPXLB with a blue (B) filter FLT-B that mainly transmits blue light and the fourth sub-pixel SPXL22 is configured as a dedicated near-infrared (NIR) sub-pixel SPXLNI that receives infrared light.

The multi-pixel MPXL20 includes, as shown in FIGS. 8A, 8B and 8C, a photoelectric converting part 210, a lens part 220, a color filter part 230, an anti-reflective film 240, a first back side separating part 250, and a second back side separating part 260.

The light incident portion of the photoelectric converting part (PD10) 210, which is a rectangular region RCT10 defined by four edges L11 to L14, is divided (segmented) into a first photoelectric converting region (PD11) 211, a second photoelectric converting region (PD12) 212, a third photoelectric converting region (PD21) 213 and a fourth photoelectric converting region (PD22) 214, which respectively correspond to the first to fourth sub-pixels SPXL11, SPXL12, SPXL21, SPXL22. The photoelectric converting part (PD10) 210 is divided (segmented), by the first back-side separating part 250 and the second back-side separating part 260, into four rectangular regions, namely, the first photoelectric converting region (PD11) 211, the second photoelectric converting region (PD12) 212, the third photoelectric converting region (PD21) 213 and the fourth photoelectric converting region (PD22) 214. This will be described in detail below.

The photoelectric converting part 210, which is divided (segmented) into the first photoelectric converting region (PD11) 211, the second photoelectric converting region (PD12) 212, the third photoelectric converting region (PD13) 213 and the fourth photoelectric converting region (PD14) 214, is buried in a semiconductor substrate 270 having a first substrate surface 271 and a second substrate surface 272 opposite to the first substrate surface 271, and is capable of photoelectrically converting received light and storing the resulting charges therein.

The color filter part 230 is provided on the first substrate surface 271 side (the back surface side) of the first photoelectric converting region (PD11) 211, the second photoelectric converting region (PD12) 212, the third photoelectric converting region (PD21) 213 and the fourth photoelectric converting region (PD22) 214 of the photoelectric converting part 210 with the anti-reflective film 240 being sandwiched therebetween. The anti-reflective film 240 serves as a flattening layer. On the second substrate surface 272 side (the front surface side) of the first photoelectric converting region (PD11) 211, the second photoelectric converting region (PD12) 212, the third photoelectric converting region (PD21) 213 and the fourth photoelectric converting region (PD22) 214, there are formed output parts OP11, OP12, OP21 and OP22 including, among others, an output transistor for outputting a signal determined by the charges produced by photoelectric conversion and stored.

The lens part 220 is formed by a single microlens MCL221 allowing light to enter the first photoelectric converting region 211 of the first sub-pixel SPXL11, the second photoelectric converting region 212 of the second sub-pixel SPXL12, the third photoelectric converting region 213 of the third sub-pixel SPXL21 and the fourth photoelectric converting region 214 of the fourth sub-pixel SPXL22.

The optical center OCT1 of the single microlens MCL221 is positioned in a pixel center region RPCT where the boundaries of the four sub-pixels, namely, the first sub-pixel SPXL11, the second sub-pixel SPXL12, the third sub-pixel SPXL21 and the fourth sub-pixel SPXL22 meet each other.

The color filter part 230 is segmented into a green (G) filter region 231, a red (R) filter region 232, a blue (B) filter region 233, and a near infrared (NIR) filter region 234, to form the respective color sub-pixels. The microlens MCL221 of the lens part 220 is provided on the light entering side of the green (G) filter region 231, the red (R) filter region 232, the blue (B) filter region 233, and the near infrared (NIR) filter region 234.

As described above, the photoelectric converting part (PD10) 210, which is the rectangular region RCT10 defined by the four edges L11 to L14, is divided (segmented) by the first back side separating part 250 and the second back side separating part 260, into four rectangular regions, namely, the first photoelectric converting region (PD11) 211, the second photoelectric converting region (PD12) 212, the third photoelectric converting region (PD21) 213 and the fourth photoelectric converting region (PD22) 214. More specifically, the light entering portion of the photoelectric converting part (PD10) 210 is divided into four portions by the back side separating part 250, which is basically positioned and shaped in the same manner as a back side metal (BSM).

The back-side separating part 250 includes a first separating part 251, a second separating part 252, a third separating part 253 and a fourth separating part 254. The first separating part 251 has a length LG1 and extends between a center point PCT of the rectangular region RCT10 defining the photoelectric converting part PD10 of the multi-pixel MPXL20 and a middle point CL11 of the edge L11. The second separating part 252 has a length LG2 and extends between the center point PCT and a middle point CL12 of the edge L12. The third separating part 253 has a length LG3 and extends between the center point PCT and a middle point CL13 of the edge L13. The fourth separating part 254 has a length LG4 and extends between the center point PCT and a middle point CL14 of the edge L14. In other words, the first separating part 251 is formed at the boundary between the first photoelectric converting region 211 of the first sub-pixel SPXL11 and the second photoelectric converting region 212 of the second sub-pixel SPXL12. The second separating part 252 is formed at the boundary between the third photoelectric converting region 213 of the third sub-pixel SPXL21 and the fourth photoelectric converting region 214 of the fourth sub-pixel SPXL22. The third separating part 253 is formed at the boundary between the first photoelectric converting region 211 of the first sub-pixel SPXL11 and the third photoelectric converting region 213 of the third sub-pixel SPXL21. The fourth separating part 254 is formed at the boundary between the second photoelectric converting region 212 of the second sub-pixel SPXL12 and the fourth photoelectric converting region 214 of the fourth sub-pixel SPXL22.

In the first embodiment, like typical back side metal BSM, the back side separating part 250 is basically formed at the boundaries between the sub-pixels SPXL11, SPXL12, SPXL21 and SPXL22 such that the back side separating part 250 protrudes from the anti-reflective film 240 into the filter part 230.

In the first embodiment, since the optical center OCT1 of the microlens 221 is positioned in the pixel center region RPCT where the boundaries of the four sub-pixels, namely, the first, second, third and fourth sub-pixels SPXL11, SPXL12, SPXL21 and SPXL22 meet each other, a portion of the back side separating part 250 that is positioned in the optical center region is made of such a material that this portion of the back side separating part 250 exhibits lower reflection (higher absorption) than the other portion of the back-side separating part outside the optical center region.

In the back-side separating part 250, the first separating part 251 includes a first low-reflection part 2511 that extends from the center point PCT of the rectangular region RCT10 defining the photoelectric converting part PD10, has a length l1 (l1<LG1), and is positioned within the optical center region, and the remaining part of the first separating part 251 (having a length of (LG1-l1) is formed as a back side metal part BSM1.

The second separating part 252 includes a second low-reflection part 2521 that extends from the center point PCT of the rectangular region RCT10, has a length l2 (l2<LG2), and is positioned within the optical center region, and the remaining part of the second separating part 252 (having a length of (LG2-l2) is formed as a back side metal part BSM2.

The third separating part 253 includes a third low-reflection part 2531 that extends from the center point PCT of the rectangular region RCT10, has a length l3 (l3<LG3), and is positioned within the optical center region, and the remaining part of the third separating part 253 (having a length of (LG3-l3) is formed as a back side metal part BSM3.

The fourth separating part 254 includes a fourth low-reflection part 2541 that extends from the center point PCT of the rectangular region RCT10, has a length l4 (l4<LG4), and is positioned within the optical center region, and the remaining part of the fourth separating part 254 (having a length of (LG4-l4) is formed as a back side metal part BSM4.

In the first embodiment, the length l1 of the first low-reflection part 2511 of the first separating part 251, the length l2 of the second low-reflection part 2521 of the second separating part 252, the length l3 of the third low-reflection part 2531 of the third separating part 253, and the length l4 of the fourth low-reflection part 2541 of the fourth separating part 254 are the same, for example (l1=l2=l3=l4).

The typical back side metal parts BSM1 to BSM4 are made of, for example, gold, aluminum, titanium, copper, chromium, palladium, nickel, silver, tungsten or the like. For example, the following materials can be used as a material exhibiting lower reflection than the metal material of the back side metal parts BSM1 to BSM4.

For example, the following materials can be used as the material that exhibits low reflection and high absorption in a specific wavelength range, for example, the NIR wavelengths (for example, 850 nm to 940 nm).

1) Inorganic dielectric material s such as oxides, silicon nitrides, hafnium, tantalum, tungsten, iridium ($Ta_2O_5$, $WO_3$, $IrO_x$) and $WO_3$, ITO (indium tin oxide), ATO (antimony tin oxide)) and any mixture of two or more of these)

2) Black filter realized using organic absorptive functional dyes and conventional dyes, or ink (for example, (1) laminated naphthalimide anion radical (2) condensed porphyrin array, (3) doped polythiophene and other related conductive polymer, (4) sandwich-type lanthanide-bisphthalocyanine, (5) conjugated diquinone radical anion (also referred to as semi-quinone) and (6) mixed valence dinuclear metal complex)

3) one or more layers of multiple materials, a nanostructure (for example, moth-eye) layer serving as an anti-reflective coating The above-listed materials are example materials of the low-reflection part, and can be replaced with, for example, an implanted layer with p-type impurities or other low-reflection materials.

In the photoelectric converting part PD10, the second back side separating part 260 is formed as a trench-shaped back side separation, which is back side deep trench isolation (BDTI), such that the second back side separating part 260 is aligned with the back side separating part 250 in the depth direction of the photoelectric converting part 210 (the depth direction of the substrate 270: the Z direction).

A trench-shaped second separating part 261 is formed such that the second separating part 261 is aligned with the first separating part 251 of the first back-side separating part 250 in the Z direction. The trench-shaped first separating part 261 includes a low-reflection part 2611 that extends from the center point PCT of the rectangular region RCT10 defining the photoelectric converting part PD10, has a length l1 (l1<LG1) and is positioned within the optical center region, and the remaining part of the first separating part 261 (having a length of (LG1–l1) is formed as a trench-shaped back side deep isolation part BDTI1.

A trench-shaped second separating part 262 is formed such that the second separating part 262 is aligned with the second separating part 252 of the first back side separating part 250 in the Z direction. The trench-shaped second separating part 262 includes a low-reflection part 2621 that extends from the center point PCT of the rectangular region RCT10, has a length l2 (l2<LG2) and is positioned within the optical center region, and the remaining part of the second separating part 262 (having a length of (LG2–l2) is formed as a trench-shaped back side deep isolation part BDTI2.

A trench-shaped third separating part 263 is formed such that the third separating part 263 is aligned with the third separating part 253 of the first back side separating part 250 in the Z direction. The trench-shaped third separating part 263 includes a low-reflection part 2631 that extends from the center point PCT of the rectangular region RCT10, has a length l3 (l3<LG3) and is positioned within the optical center region, and the remaining part of the third separating part 263 (having a length of (LG3–l3) is formed as a trench-shaped back side deep isolation part BDTI3.

A trench-shaped fourth separating part 264 is formed such that the fourth separating part 264 is aligned with the fourth separating part 254 of the first back-side separating part 250 in the Z direction. The trench-shaped fourth separating part 264 includes a low-reflection part 2641 that extends from the center point PCT of the rectangular region RCT10, has a length l4 (l4<LG4) and is positioned within the optical center region, and the remaining part of the fourth separating part 264 (having a length of (LG4–l4) is formed as a trench-shaped back side deep isolation part BDTI4.

In the low-reflection parts 2611, 2621, 2631 and 2641 of the second back side separating part 260, a layer made of a material exhibiting lower reflection than the metal material of the back side metal parts BSM1 to BSM4 and the trench-shaped back side deep isolation parts BDTI1 to BDTI4 is buried, like the low-reflection parts 2511, 2521, 2531 and 2541 of the first back-side separating part 250.

In the first embodiment, the multi-pixel MPXL20 includes the back side separating part 250 separating a plurality of adjacent sub-pixels from each other at least in the light entering portion of the photoelectric converting region, the trench-shaped second back side separating part 260, and the lens part 220 including a single microlens MCL221 allowing light to enter the photoelectric converting regions PD11, PD12, PD21 and PD22 of the four sub-pixels SPXL11, SPXL12, SPXL21 and SPXL22. In the first embodiment, the optical center of the microlens MCL221 of the lens part 220 is positioned at the location where the first back side separating part 250 and the second back side separating part 260 are formed, and the first back side separating part 250 and the second back side separating part 260 are each formed such that at least the optical center region of the back side separating part exhibits lower reflection (higher absorption) than the other region of the back side separating part.

With the above-described configurations, every sub-pixel can have distance information in the first embodiment, which can be applied to provide for the PDAF capability. Even if the optical center of the microlens is positioned at the location where the back side metal (BSM) is formed, the radical reduction in the sensitivity at the optical center, which may be caused by reflection, can be prevented. As a consequence, the first embodiment produces little crosstalk between adjacent sub-pixels, can reduce the influence of the luminance shading, and even prevent the degradation in the sensitivity at the optical center.

Second Embodiment

FIGS. 9A to 9C schematically show an example configuration of a solid-state imaging device (a CMOS image sensor) according to a second embodiment of the present invention. FIG. 9A is a plan view schematically showing an example arrangement of constituents of the solid-state imaging device (the CMOS image sensor) formed as an NIR-RGB sensor. FIG. 9B is a simplified sectional view along the line x11-x12 in FIG. 9A. FIG. 9C is a simplified sectional view along the line y11-y12 in FIG. 9A.

The second embodiment differs from the first embodiment in the following points. In the first embodiment, since the optical center OCT1 of the microlens MCL221 is positioned in the pixel center region RPCT where the boundaries of the four sub-pixels, namely, the first, second, third and fourth sub-pixels SPXL11, SPXL12, SPXL21 and SPXL22 meet each other, a low-reflection part is defined in the first to fourth separating parts 251 to 254 of the back side separating part 250. The low reflection parts of the first to fourth separating parts 251 to 254 are located in the optical center region ROCT1 and made of such a material that the low-reflection parts exhibit lower reflection (higher absorption) than the other region of the back side separating part outside the optical center region OCT1.

In the second embodiment, on the other hand, the first to fourth separating parts 251A to 254A of the first back side separating part 250 are entirely configured as a low-reflection part or made of a low-reflection (high-absorption) material, not only in the part corresponding to the optical center region. Likewise, the first to fourth separating parts 261A to 264A of the second back side separating part 260 are entirely configured as a low-reflection part or made of a low-reflection (high-absorption) material.

The second embodiment not only produces the same effects as the above-described first embodiment but also can further prevent radical reduction in the sensitivity at the optical center, which may be caused by reflection or the like, even if the optical center of the microlens is positioned at the location where the back-side metal (BSM) is formed.

Third Embodiment

Figure 10A:
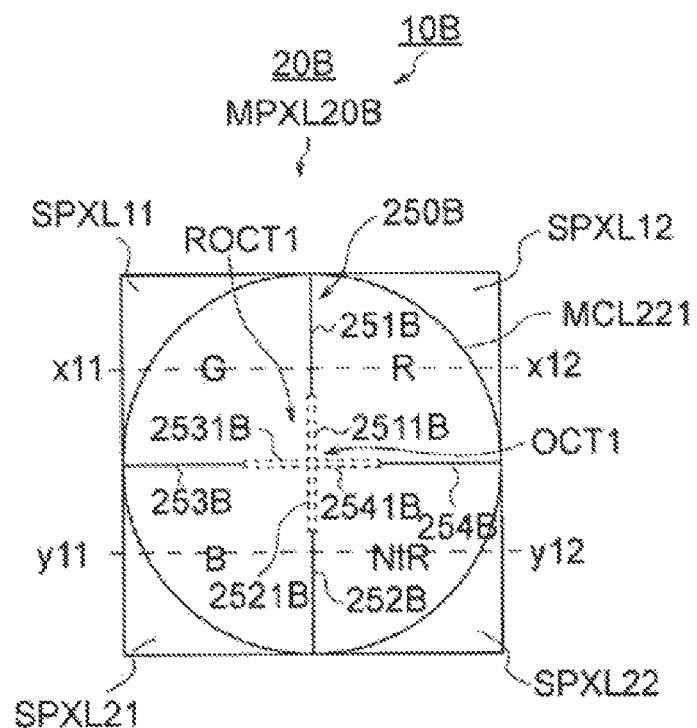
FIGS. 10A to 10C schematically show an example configuration of a solid-state imaging device (a CMOS image sensor) according to a third embodiment of the present invention.
Figures 10B, 10C:
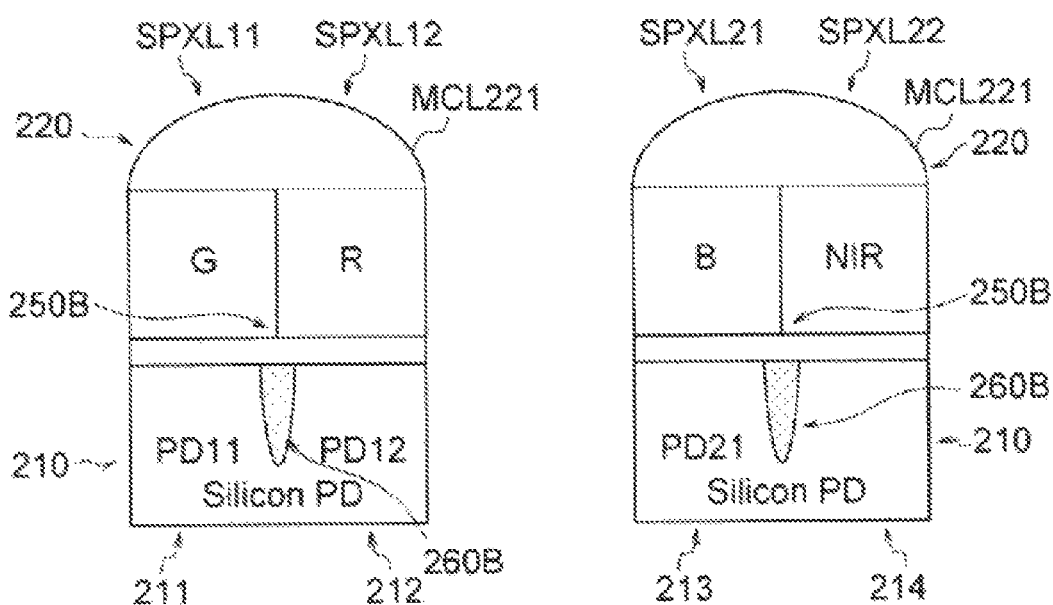

FIGS. 10A to 10C schematically show an example configuration of a solid-state imaging device (a CMOS image sensor) according to a third embodiment of the present invention. FIG. 10A is a plan view schematically showing an example arrangement of constituents of the solid-state imaging device (the CMOS image sensor) formed as an NIR-RGB sensor. FIG. 10B is a simplified sectional view along the line x11-x12 in FIG. 10A. FIG. 10C is a simplified sectional view along the line y11-y12 in FIG. 10A.

The third embodiment differs from the first embodiment in the following points. In the first embodiment, since the optical center OCT1 of the microlens 221 is positioned in the pixel center region RPCT where the boundaries of the four sub-pixels, namely, the first, second, third and fourth sub-pixels SPXL11, SPXL12, SPXL21 and SPXL22 meet each other, a low-reflection part is defined in the first to fourth separating parts 251 to 254 of the back-side separating part 250. The low reflection parts of the first to fourth separating parts 251 to 254 are located in the optical center region ROCT1 and made of such a material that the low-reflection parts exhibit lower reflection (higher absorption) than the other region of the back side separating part outside the optical center region OCT1.

In the third embodiment, on the other hand, the back side metal parts BSM1 to BSM4 are removed in the low-reflection parts 2511B, 2521B, 2531B and 2541B of the first to fourth separating parts 251B to 254B of the first back side separating part 250B, so that low reflection (high absorption) is achieved in the low-reflection parts. The trench-shaped back-side deep isolation parts BDTI1 to BDTI4 of the low reflection parts 2611B, 2621B, 2631B and 2641B of the first to fourth separating parts 261B to 264B of the second back side separating part 260B are made of a low-reflection (high-absorption) material.

The third embodiment not only produce the same effects as the above-described first embodiment but also can further prevent radical reduction in the sensitivity at the optical center, which may be caused by reflection or the like, even if the optical center of the microlens is positioned at the location where the back-side metal (BSM) is formed.

Fourth Embodiment

Figure 11A:
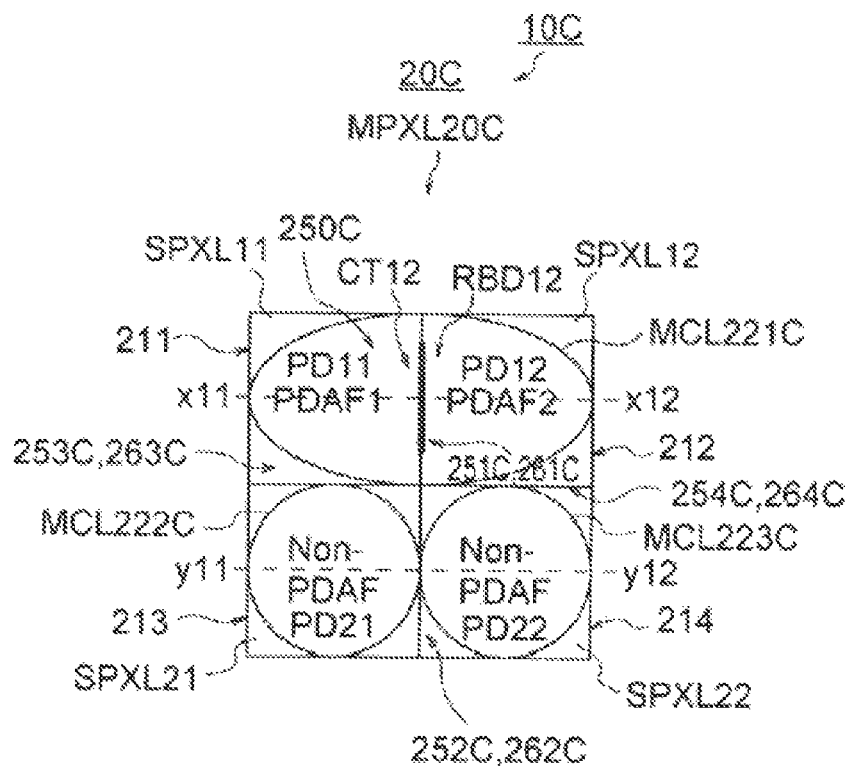
FIGS. 11A to 11C schematically show an example configuration of a solid-state imaging device (a CMOS image sensor) according to a fourth embodiment of the present invention.
Figures 11B, 11C:
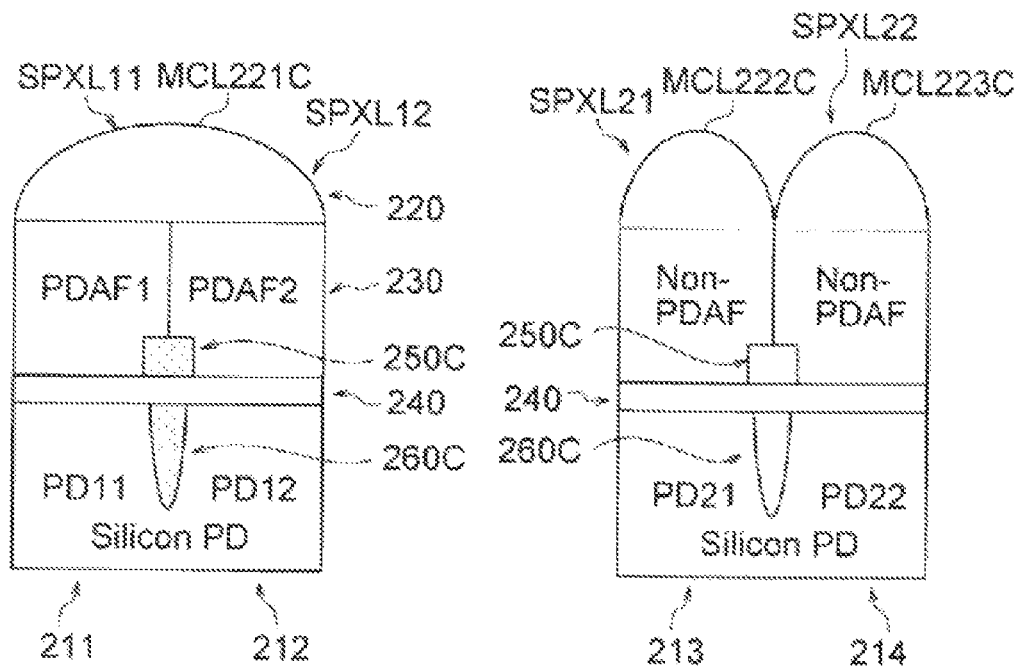

FIGS. 11A to 11C schematically show an example configuration of a solid-state imaging device (a CMOS image sensor) according to a fourth embodiment of the present invention. FIG. 11A is a plan view schematically showing an example arrangement of constituents of the solid-state imaging device (the CMOS image sensor) formed as a sensor having partial PDAF capability in the multi-pixel. FIG. 11B is a simplified sectional view along the line x11-x12 in FIG. 11A. FIG. 11C is a simplified sectional view along the line y11-y12 in FIG. 11A.

The fourth embodiment differs from the first embodiment in the following points. In the first embodiment, the lens part 220 of the multi-pixel MPXL20C includes a single microlens MCL221C allowing light to enter the photoelectric converting regions PD11, PD12, PD21 and PD22 of the four sub-pixels SPXL11, SPXL12, SPXL21 and SPXL22, the optical center of the microlens is positioned at the location where the first and second back side separating parts 250C and 260C are formed, and the first and second back-side separating parts 250C and 260C are formed such that at least the optical center region of the back side separating parts exhibits lower reflection (higher absorption) than the other region of the back side separating parts.

In the fourth embodiment, on the other hand, the lens part 220 of the multi-pixel MPXL20C includes a first microlens MCL221C allowing light to enter the first photoelectric converting region PD11 of the first sub-pixel SPXL11 and the second photoelectric converting region PD12 of the second sub-pixel SPXL12, a second microlens MCL222C allowing light to enter the third photoelectric converting region PD21 of the third sub-pixel SPXL21, and a third microlens MCL223C allowing light to enter the fourth photoelectric converting region PD22 of the fourth sub-pixel SPXL22. The optical center of the first microlens MCL221C is positioned in a center region CT12 of a boundary region RBD12 between the first photoelectric converting region PD11 of the first sub-pixel SPXL11 and the second photoelectric converting region PD12 of the second sub-pixel SPXL12. A low-reflection part is defined in the first separating part 251C of the first back side separating part 250C (and the first separating part 261C of the second back side separating part 260C), which is positioned in the boundary region RBD12. The low-reflection part is positioned in the center region CT12 of the boundary region RBD12, which includes the optical center, and made of a material that exhibits lower reflection (higher absorption) than the other region of the back side separating part outside the optical center region.

In the solid-state imaging device 10C relating to the fourth embodiment, in the boundary region the first photoelectric converting region (PD11) 211 of the first sub-pixel SPXL11 and the second photoelectric converting region (PD12) 212 of the second sub-pixel SPXL12, the first separating parts 251C and 261C are formed that include therein a low-reflection part positioned in the center region CT12 of the boundary region. Second separating parts 252C and 262C without a low-reflection part are formed in the boundary region between the third photoelectric converting region (PD21) 213 of the third sub-pixel SPXL21 and the fourth photoelectric converting region (PD22) 214 of the fourth sub-pixel SPXL22. Third separating parts 253C and 263C without a low-reflection part are formed in the boundary region between the first photoelectric converting region (PD11) 211 of the first sub-pixel SPXL11 and the third photoelectric converting region (PD21) 213 of the third sub-pixel SPXL21. Fourth separating parts 254C and 264C without a low-reflection part are formed in the boundary region between the second photoelectric converting region (PD12) 212 of the second sub-pixel SPXL12 and the fourth photoelectric converting region (PD22) 214 of the fourth sub-pixel SPXL22.

Here, the optical center of the second microlens MCL222C coincides with the optical center of the third photoelectric converting region PD21, and the optical center of the third microlens MCL223C coincides with the optical center of the fourth photoelectric converting region PD22.

In the solid-state imaging device 10C relating to the fourth embodiment, the two sub-pixels sharing the microlens MCL11, namely, the first and second sub-pixels SPXL11 and SPXL12, are partially capable of having PDAF information. In the example shown in FIGS. 11A to 11C, the first sub-pixel SPXL11 can have information PDAF1, and the second sub-pixel SPXL12 can have information PDAF2. On the other hand, the third and fourth sub-pixels SPXL21 and SPXL22, which share no microlens, do not have information PDAF.

Modification Examples of Fourth Embodiment

Figure 12A:
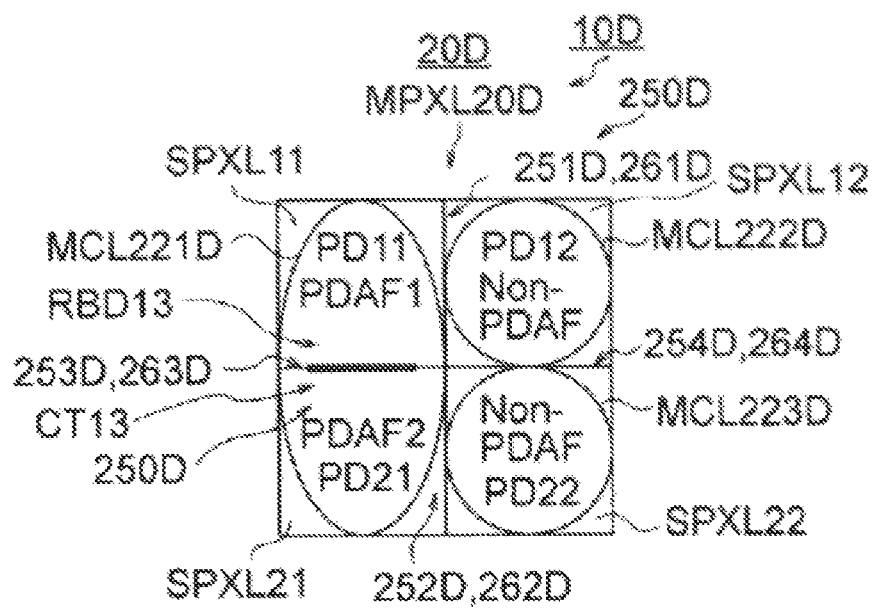
FIGS. 12A to 12C schematically show a modification example of the solid-state imaging device (the CMOS image sensor) according to the fourth embodiment of the present invention.
Figure 12B:
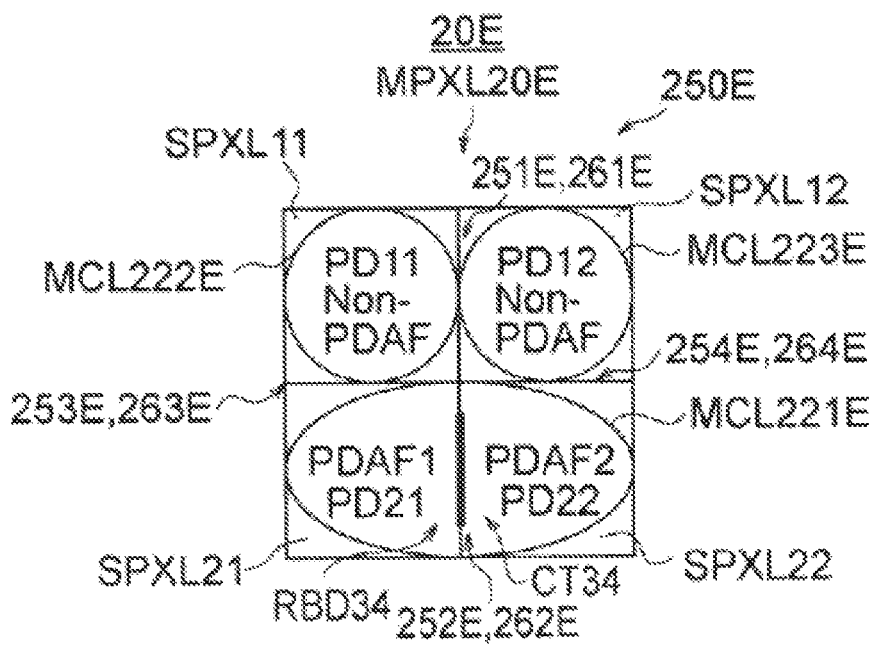
Figure 12C:
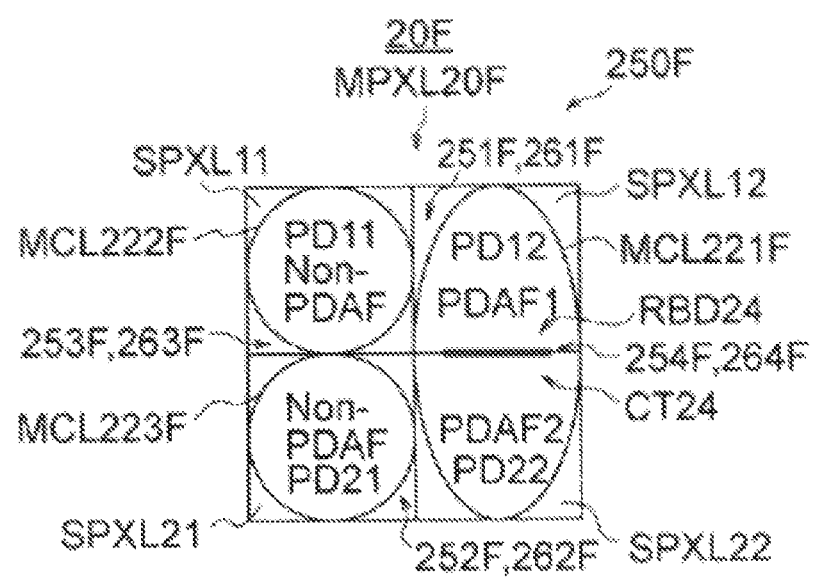

FIGS. 12A to 12C schematically show a modification example of the solid-state imaging device (the CMOS image sensor) according to the fourth embodiment of the present invention.

FIG. 12A is a plan view showing a first modification example of the solid-state imaging device (the CMOS image sensor) formed as a sensor that partially provides for PDAF capability in the multi-pixel.

The first modification example of FIG. 12A includes a first microlens MCL221D allowing light to enter the first photoelectric converting region PD11 of the first sub-pixel SPXL11 and the third photoelectric converting region PD21 of the third sub-pixel SPXL21, a second microlens MCL222D allowing light to enter the second photoelectric converting region PD12 of the second sub-pixel SPXL12, and a third microlens MCL223D allowing light to enter the fourth photoelectric converting region PD22 of the fourth sub-pixel SPXL22. The optical center of the first microlens MCL221D is positioned in a center region CT13 of a boundary region RBD13 between the first photoelectric converting region PD11 of the first sub-pixel SPXL11 and the third photoelectric converting region PD21 of the third sub-pixel SPXL21. A low-reflection part is defined in the third separating part 253D of the first back side separating part 250D (and the third separating part 263D of the second back side separating part 260D), which is positioned in the boundary region RBD13. The low-reflection part is positioned in a center region CT13 of the boundary region RBD13, which includes the optical center, and made of a material that exhibits lower reflection (higher absorption) than the other region of the back side separating part outside the optical center region.

In the first modification example, first separating parts 251D and 261D without a low-reflection part are formed in the boundary region between the first photoelectric converting region PD11 of the first sub-pixel SPXL11 and the second photoelectric converting region PD12 of the second sub-pixel SPXL12. Second separating parts 252D and 262D without a low-reflection part are formed in the boundary region between the third photoelectric converting region PD21 of the third sub-pixel SPXL21 and the fourth photoelectric converting region PD22 of the fourth sub-pixel SPXL22. In the boundary region between the first photoelectric converting region PD11 of the first sub-pixel SPXL11 and the third photoelectric converting region PD21 of the third sub-pixel SPXL21, the third separating parts 253D and 263D with a low-reflection part being positioned in the center region CT13 of the boundary region are formed. Fourth separating parts 254D and 264D without a low-reflection part are formed in the boundary region between the second photoelectric converting region PD12 of the second sub-pixel SPXL12 and the fourth photoelectric converting region PD22 of the fourth sub-pixel SPXL22.

Here, the optical center of the second microlens MCL222D coincides with the optical center of the second photoelectric converting region PD12, and the optical center of the third microlens MCL223D coincides with the optical center of the fourth photoelectric converting region PD22.

In the first modification example, the two sub-pixels sharing the microlens MCL221D, namely, the first and third sub-pixels SPXL11 and SPXL21, which, are partially capable of having PDAF information. In the example shown in FIG. 12A, the first sub-pixel SPXL11 can have information PDAF1, and the third sub-pixel SPXL21 can have information PDAF2. On the other hand, the second and fourth sub-pixels SPXL12 and SPXL22, which share no microlens, do not have information PDAF.

FIG. 12B is a plan view showing a second modification example of the solid-state imaging device (the CMOS image sensor) formed as a sensor that partially provides for PDAF capability in the multi-pixel.

The second modification example of FIG. 12B includes a first microlens MCL221E allowing light to enter the third photoelectric converting region PD21 of the third sub-pixel SPXL21 and the fourth photoelectric converting region PD22 of the fourth sub-pixel SPXL22, a second microlens MCL222E allowing light to enter the first photoelectric converting region PD11 of the first sub-pixel SPXL11, and a third microlens MCL223E allowing light to enter the second photoelectric converting region PD12 of the second sub-pixel SPXL12. The optical center of the first microlens MCL221E is positioned in a center region CT34 of a boundary region RBD34 between the third photoelectric converting region PD21 of the third sub-pixel SPXL21 and the fourth photoelectric converting region PD22 of the fourth sub-pixel SPXL22. A low-reflection part is defined in the second separating part 252E of the first back side separating part 250E (and the second separating part 262E of the second back side separating part 260E), which is positioned in the boundary region RBD34. The low-reflection part is positioned in the center region CT34 of the boundary region RBD34, which includes the optical center, and made of a material that exhibits lower reflection (higher absorption) than the other region of the back side separating part outside the optical center region.

In the second modification example, first separating parts 251E and 261E without a low-reflection part are formed in the boundary region between the first photoelectric converting region PD11 of the first sub-pixel SPXL11 and the second photoelectric converting region PD12 of the second sub-pixel SPXL12. In the boundary region between the third photoelectric converting region PD21 of the third sub-pixel SPXL21 and the fourth photoelectric converting region PD22 of the fourth sub-pixel SPXL22, second separating parts 252E and 262E with a low-reflection part being positioned in a center region CT34 of the boundary region are formed. Third separating parts 253E and 263E without a low-reflection part are formed in the boundary region between the first photoelectric converting region 211 of the first sub-pixel SPXL11 and the third photoelectric converting region PD21 of the third sub-pixel SPXL22. Fourth separating parts 254E and 264E without a low-reflection part are formed in the boundary region between the second photoelectric converting region PD12 of the second sub-pixel SPXL12 and the fourth photoelectric converting region PD22 of the fourth sub-pixel SPXL22.

Here, the optical center of the second microlens MCL222E coincides with the optical center of the first photoelectric converting region PD11, and the optical center of the third microlens MCL223E coincides with the optical center of the second photoelectric converting region PD12.

In the second modification example, the sub-pixels sharing the microlens MCL11, namely, the third and fourth sub-pixels SPXL21 and SPXL22 are partially capable of having PDAF information. In the example shown in FIG.

12B, the third sub-pixel SPXL21 can have information PDAF1, and the fourth sub-pixel SPXL22 can have information PDAF2. On the other hand, the first and second sub-pixels SPXL11 and SPXL12, which share no microlens, do not have information PDAF.

FIG. 12C is a plan view showing a third modification example of the solid-state imaging device (the CMOS image sensor) formed as a sensor that partially provides for PDAF capability in the multi-pixel.

The third modification example of FIG. 12C includes a first microlens MCL221F allowing light to enter the second photoelectric converting region PD12 of the second sub-pixel SPXL12 and the fourth photoelectric converting region PD22 of the fourth sub-pixel SPXL22, a second microlens MCL222F allowing light to enter the first photoelectric converting region PD11 of the first sub-pixel SPXL11, and a third microlens MCL223F allowing light to enter the second photoelectric converting region PD21 of the third sub-pixel SPXL21. The optical center of the first microlens MCL221F is positioned in a center region CT24 of a boundary region RBD24 between the second photoelectric converting region PD12 of the second sub-pixel SPXL12 and the fourth photoelectric converting region PD222 of the fourth sub-pixel SPXL22. A low-reflection part is defined in the fourth separating part 254F of the first back side separating part 250F (and the first separating part 264F of the second back side separating part 260F), which is positioned in the boundary region RBD24. The low-reflection part is positioned in the center region CT24 of the boundary region RBD24, which includes the optical center, and made of a material that exhibits lower reflection (higher absorption) than the other region of the back side separating part outside the optical center region.

In the third modification example, first separating parts 251F and 261F without a low-reflection part are formed in the boundary region between the first photoelectric converting region PD11 of the first sub-pixel SPXL11 and the second photoelectric converting region PD12 of the second sub-pixel SPXL12. Second separating parts 252F and 262F without a low-reflection part are formed in the boundary region between the third photoelectric converting region PD21 of the third sub-pixel SPXL21 and the fourth photoelectric converting region PD22 of the fourth sub-pixel SPXL22. Third separating parts 253F and 263F without a low-reflection part are formed in the boundary region between the first photoelectric converting region PD11 of the first sub-pixel SPXL11 and the third photoelectric converting region PD21 of the third sub-pixel SPXL21. In the boundary region between the second photoelectric converting region PD12 of the second sub-pixel SPXL12 and the fourth photoelectric converting region PD22 of the fourth sub-pixel SPXL22, the fourth separating parts 254F and 264F with a low-reflection part being positioned in the center region CT24 of the boundary region are formed.

Here, the optical center of the second microlens MCL222F coincides with the optical center of the first photoelectric converting region PD11, and the optical center of the third microlens MCL223F coincides with the optical center of the third photoelectric converting region PD21.

In the third modification example, the two sub-pixels sharing the microlens MCL221F, namely, the second and fourth sub-pixels SPXL12 and SPXL22 are partially capable of having PDAF information. In the example shown in FIG. 12C, the second sub-pixel SPXL12 can have information PDAF1, and the fourth sub-pixel SPXL22 can have information PDAF2. On the other hand, the first and third sub-pixels SPXL11 and SPXL21, which share no microlens, do not have information PDAF.

The fourth embodiment can produce the same effects as the above-described first embodiment, more specifically, produces little crosstalk between adjacent sub-pixels, can reduce the influence of the luminance shading, and can even prevent the degradation in the sensitivity at the optical center. Furthermore, the sub-pixels sharing a single microlens can provide for PDAF capability.

Fifth Embodiment

Figure 13A:
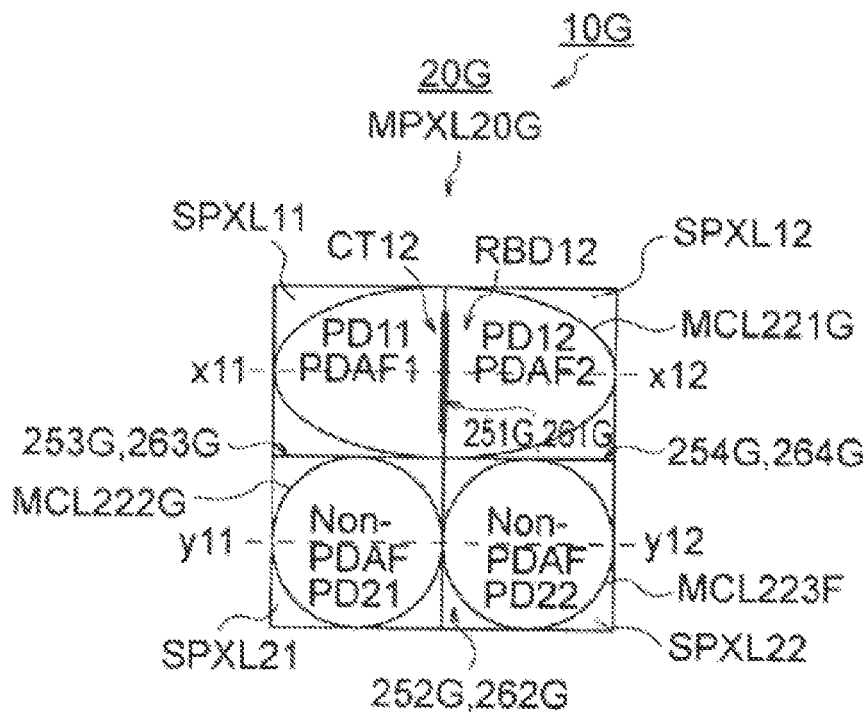
FIGS. 13A to 13C schematically show an example configuration of a solid-state imaging device (a CMOS image sensor) according to a fifth embodiment of the present invention.
Figures 13B, 13C:
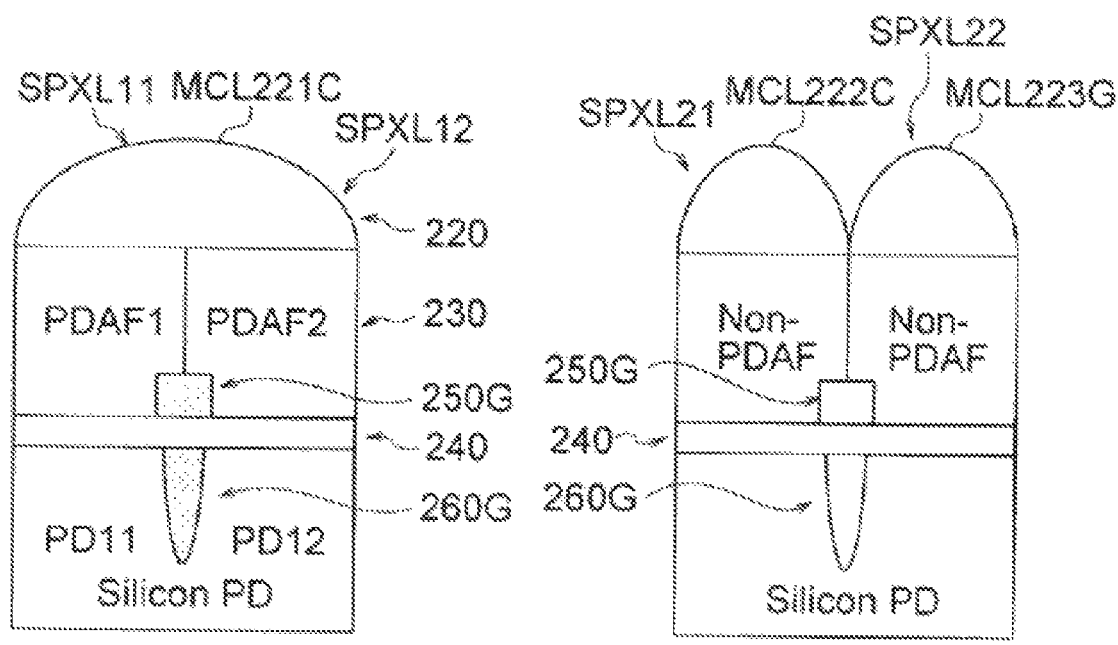

FIGS. 13A to 13C schematically show an example configuration of a solid-state imaging device (a CMOS image sensor) according to a fifth embodiment of the present invention. FIG. 13A is a plan view schematically showing an example arrangement of constituents of the solid-state imaging device (the CMOS image sensor) formed as a sensor that partially provides for PDAF capability in the multi-pixel. FIG. 13B is a simplified sectional view along the line x11-x12 in FIG. 13A. FIG. 13C is a simplified sectional view along the line y11-y12 in FIG. 13A.

The fifth embodiment differs from the fourth embodiment in the following points. In the fourth embodiment, the optical center of the first microlens MCL221C is positioned in the center region CT12 of the boundary region RBD12 between the first photoelectric converting region PD11 of the first sub-pixel SPXL11 and the second photoelectric converting region PD12 of the second sub-pixel SPXL12. A low-reflection part is defined in the first separating part 251C of the first back side separating part 250C (and the first separating part 261C of the second back side separating part 260C), which is positioned in the boundary region RBD12. The low-reflection part is positioned in the center region CT12 of the boundary region RBD12, which includes the optical center, and made of a material that exhibits lower reflection (higher absorption) than the other region of the back side separating part outside the optical center region.

In the fifth embodiment, on the other hand, the first separating part 251G of the first back-side separating part 250G is entirely configured as a low-reflection part or made of a low-reflection (high-absorption) material, not only in the part corresponding to the optical center region. Likewise, the first separating part 261G of the second back side separating part 260G is entirely configured as a low-reflection part or made of a low-reflection (high-absorption) material.

The above configurations can be applied to the above-described first, second and third modification examples.

The fifth embodiment not only produces the same effects as the above-described fourth embodiment but also can further prevent the radical reduction in the sensitivity at the optical center, which may be caused by reflection or the like, even if the optical center of the microlens is positioned at the location where the back-side metal (BSM) is formed.

Sixth Embodiment

FIGS. 14A to 14C schematically show an example configuration of a solid-state imaging device (a CMOS image sensor) according to a sixth embodiment of the present invention. FIG. 14A is a plan view schematically showing an example arrangement of constituents of the solid-state imaging device (the CMOS image sensor) formed as a sensor that partially provides for PDAF capability in the multi-pixel. FIG. 14B is a simplified sectional view along the line x11-x12 in FIG. 14A. FIG. 14C is a simplified sectional view along the line y11-y12 in FIG. 14A.

The sixth embodiment differs from the fourth and fifth embodiments in the following points. In the fourth and fifth embodiments, a low-reflection part is defined in the first separating parts 251C and 251G of the first back side separating parts 250C and 250G, which are arranged in the boundary region RBD12 between the first photoelectric converting region PD11 of the first sub-pixel SPXL11 and the second photoelectric converting region PD12 of the second sub-pixel SPXL12. The low-reflection part is positioned in the center region CT12 of the boundary region RBD12, which includes the optical center, and made of a material that exhibits lower reflection (higher absorption) than the other region of the back side separating part outside the optical center region. Alternatively, the first separating parts 251C and 251G of the first back side separating parts 250C and 250G are entirely configured as a low-reflection part or made of a low-reflection (high-absorption) material, not only in the part corresponding to the optical center region.

In the sixth embodiment, on the other hand, the back side metal part BSM1 is removed in the low-reflection part of the first separating part 251H of the first back side separating part 250H, so that low reflection (high absorption) is achieved in the low-reflection part.

The above configurations can be applied to the above-described first, second and third modification examples.

The sixth embodiment not only produces the same effects as the above-described fourth and fifth embodiments but also can further prevent the radical reduction in the sensitivity at the optical center, which may be caused by reflection or the like, even if the optical center of the microlens is positioned at the location where the back side metal (BSM) is formed.

Seventh Embodiment

Figure 15:
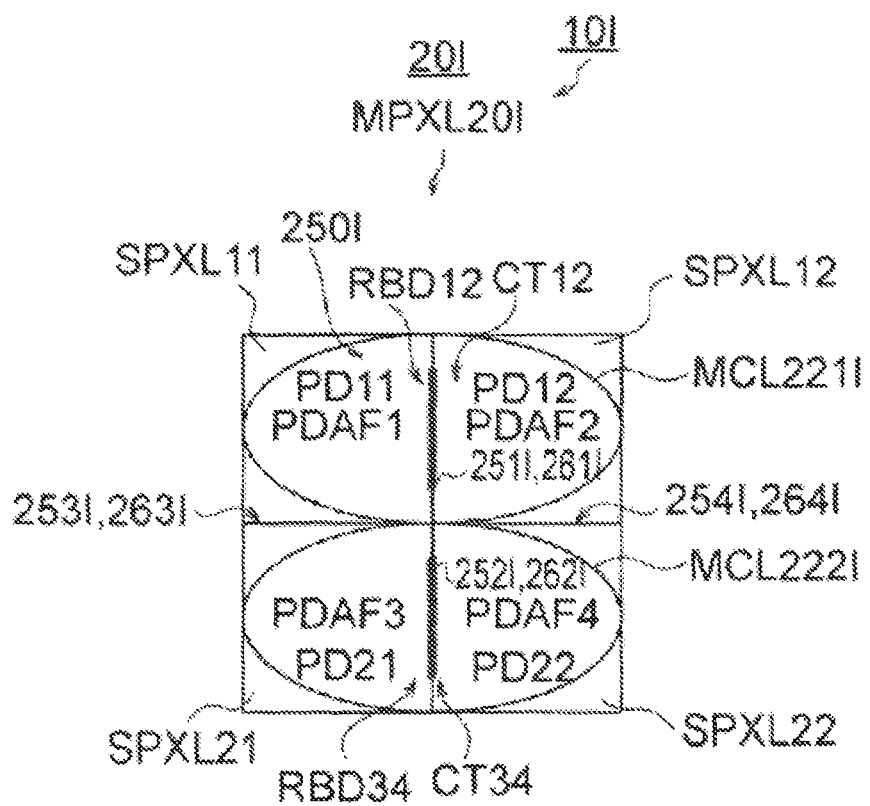
FIG. 15 schematically shows an example configuration of a solid-state imaging device (a CMOS image sensor) according to a seventh embodiment of the present invention.

FIG. 15 schematically shows an example configuration of a solid-state imaging device (a CMOS image sensor) according to a seventh embodiment of the present invention.

The seventh embodiment differs from the fourth embodiment in the following points. The fourth embodiment includes the first microlens MCL221C allowing light to enter the first photoelectric converting region PD11 of the first sub-pixel SPXL11 and the second photoelectric converting region PD12 of the second sub-pixel SPXL12, the second microlens MCL222C allowing light to enter the third photoelectric converting region PD21 of the third sub-pixel SPXL21, and the third microlens MCL223C allowing light to enter the fourth photoelectric converting region PD22 of the fourth sub-pixel SPXL22. A low-reflection part is defined in the first separating part 251C of the first back side separating part 250C (and the first separating part 261C of the second back side separating part 260C), which is arranged in the boundary region RBD12 between the first photoelectric converting region PD11 of the first sub-pixel SPXL11 and the second photoelectric converting region PD12 of the second sub-pixel SPXL12. The low-reflection part is positioned in the center region CT12 of the boundary region RBD12, which includes the optical center, and made of a material that exhibits lower reflection (higher absorption) than the other region of the back side separating part outside the optical center region.

In the solid-state imaging device 10I relating to the seventh embodiment, on the other hand, the third and fourth sub-pixels SPXL21 and SPXL22 share the microlens MCL222I, so that the two sub-pixels sharing the microlens MCL222I, namely, the third and fourth sub-pixels SPXL21 and SPXL22 are also partially capable of having PDAF information.

In the boundary region between the first photoelectric converting region PD11 of the first sub-pixel SPXL11 and the second photoelectric converting region PD12 of the second sub-pixel SPXL12, first separating parts 251I and 261I are formed and have a low-reflection part defined therein and positioned in a center region CT12 of the boundary region. In the boundary region between the third photoelectric converting region PD21 of the third sub-pixel SPXL21 and the fourth photoelectric converting region PD22 of the fourth sub-pixel SPXL22, second separating parts 252I and 262I are formed and have a low-reflection part defined therein and positioned in a center region CT34 of the boundary region. Third separating parts 253I and 263I without a low-reflection part are formed in the boundary region between the first photoelectric converting region PD11 of the first sub-pixel SPXL11 and the third photoelectric converting region PD21 of the third sub-pixel SPXL21. Fourth separating parts 254I and 264I without a low-reflection part are formed in the boundary region between the second photoelectric converting region PD12 of the second sub-pixel SPXL12 and the fourth photoelectric converting region PD22 of the fourth sub-pixel SPXL22.

Figure 1A:
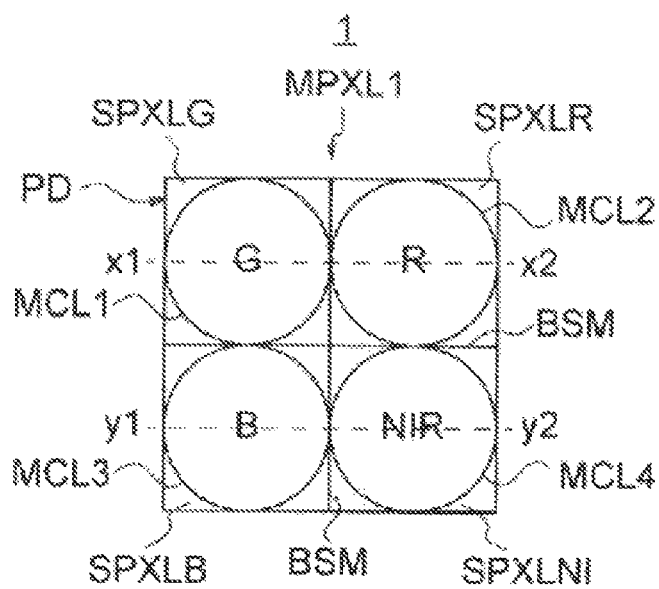
FIGS. 1A to 1C schematically show a first example configuration of a solid-state imaging device (a CMOS image sensor) where each sub-pixel has a microlens.
Figures 1B, 1C:
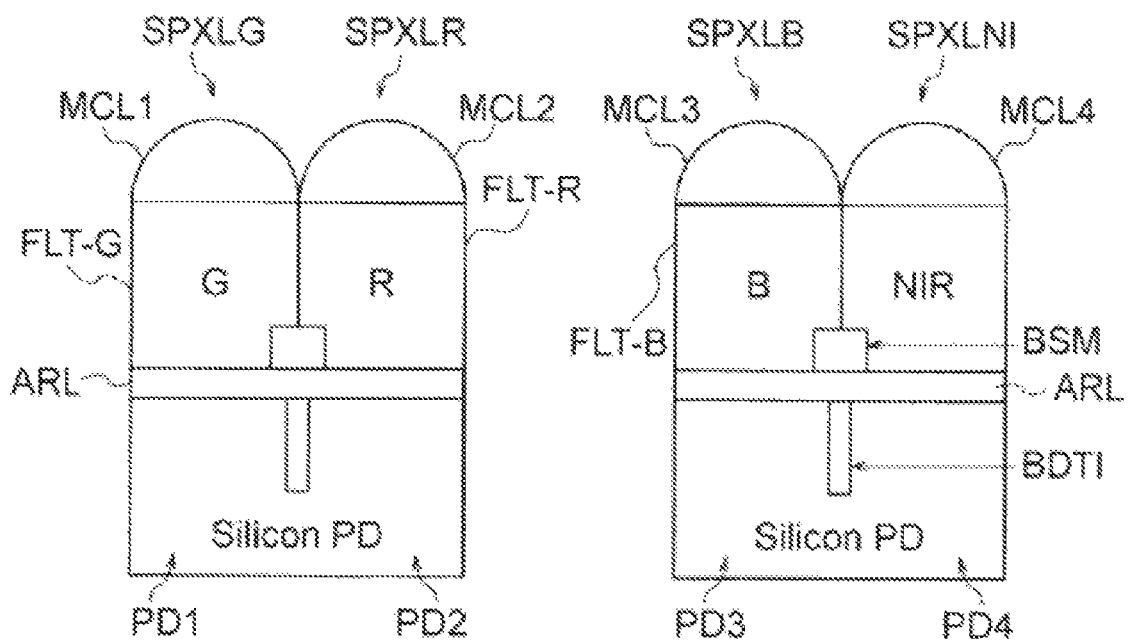
Figure 2A:
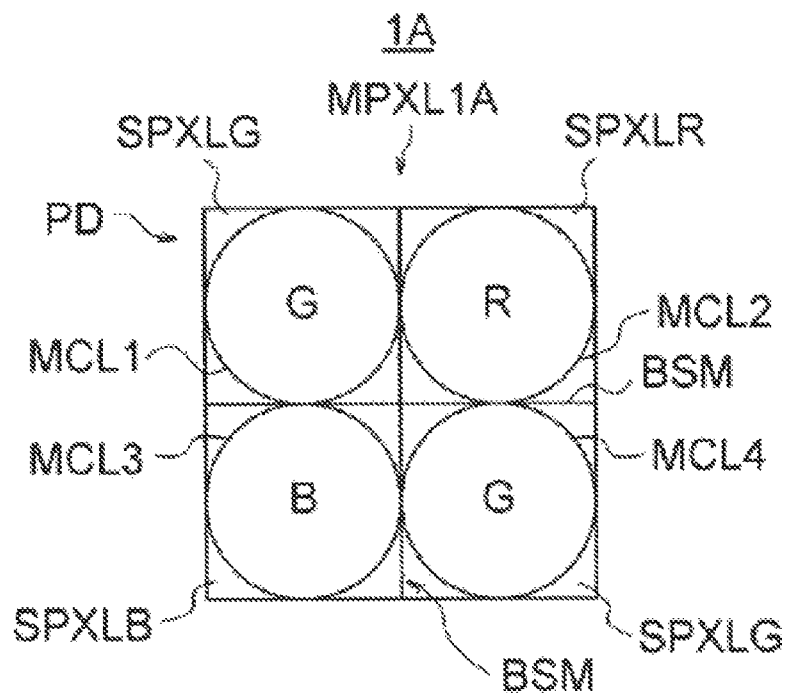
FIGS. 2A and 2B schematically show second and third example configurations of a solid-state imaging device (a CMOS image sensor) where each sub-pixel has a microlens.
Figure 2B:
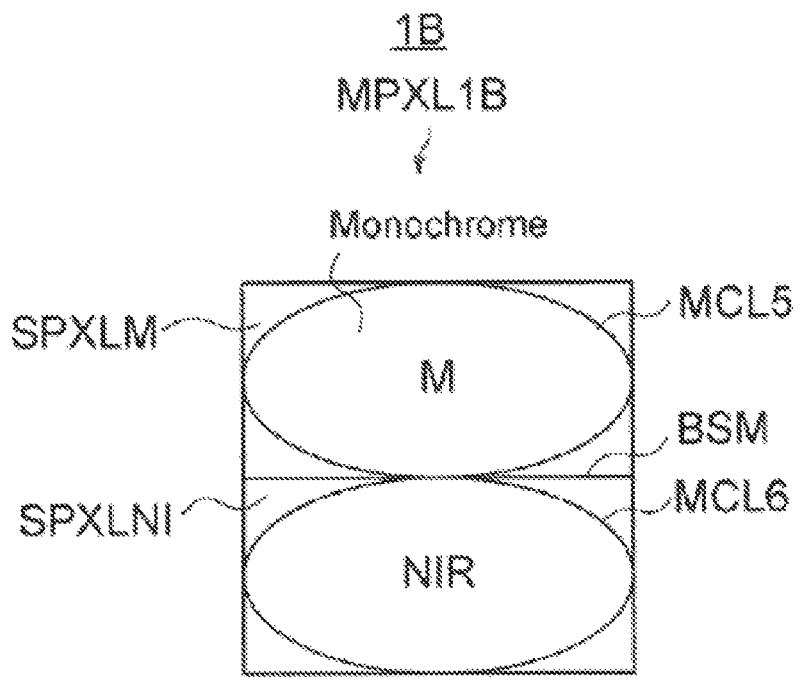
Figure 3A:
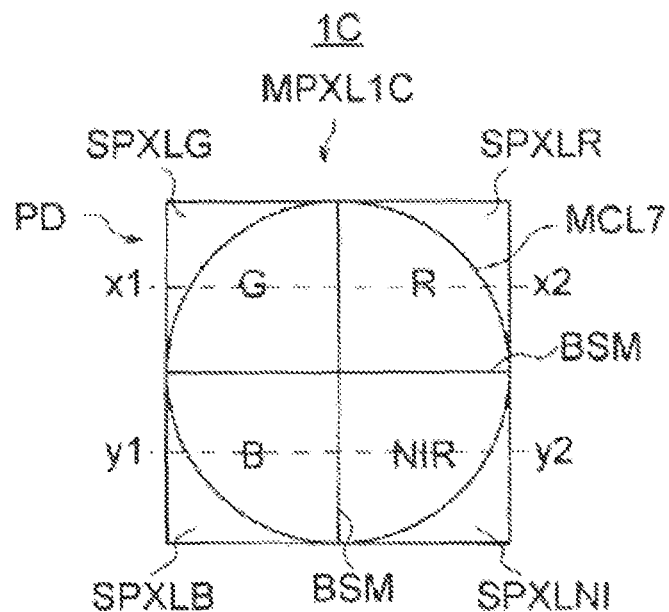
FIGS. 3A to 3C schematically show a fourth example configuration of a solid-state imaging device (a CMOS image sensor) where a plurality of sub-pixels share a single microlens.
Figure 3B:
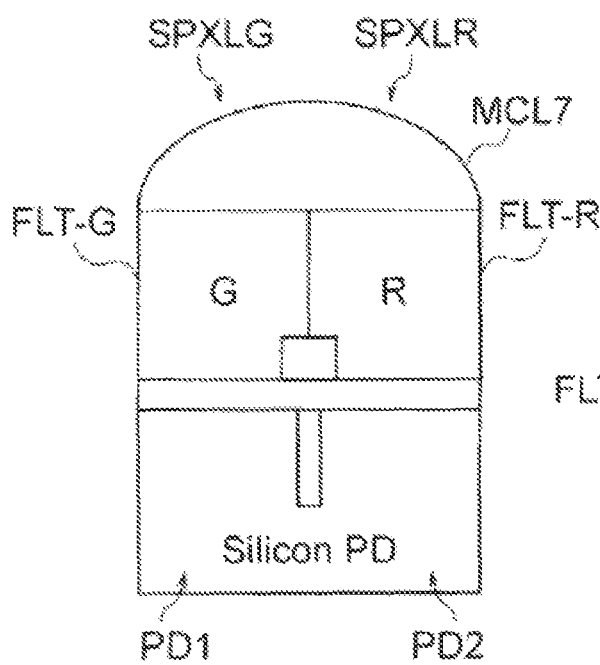
Figure 3C:
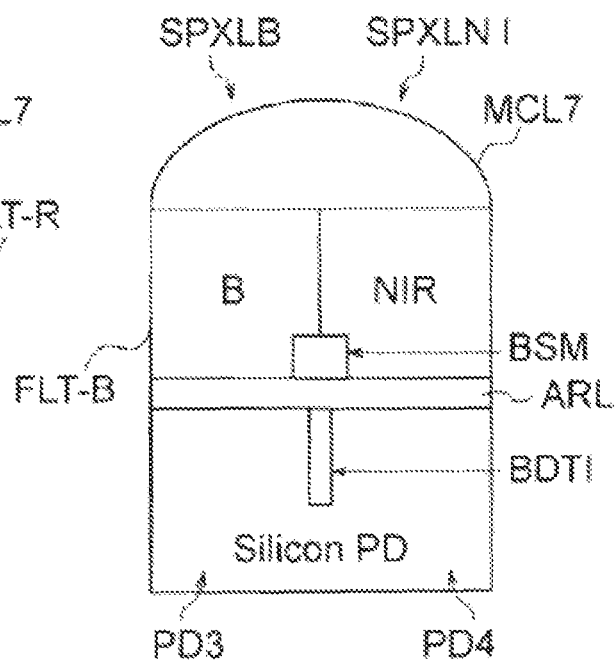
Figure 4A:
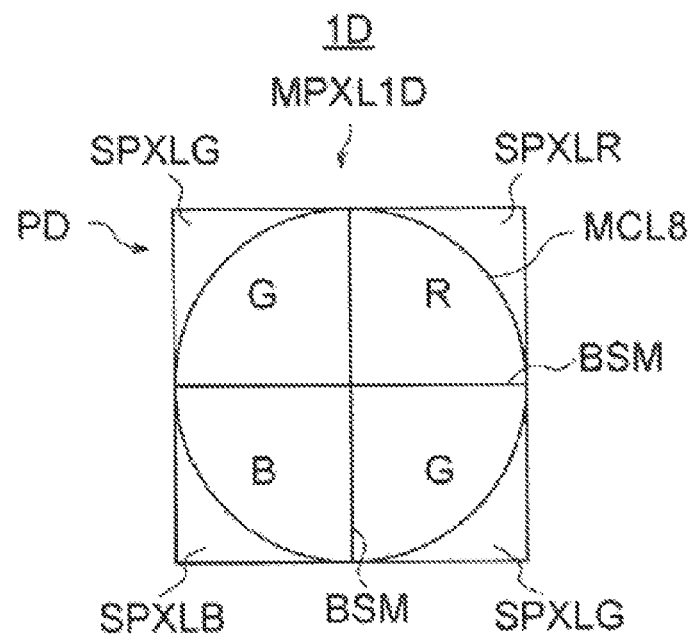
FIGS. 4A and 4B schematically show fifth and sixth example configurations of a solid-state imaging device (a CMOS image sensor) where a plurality of sub-pixels share a single microlens.
Figure 4B:
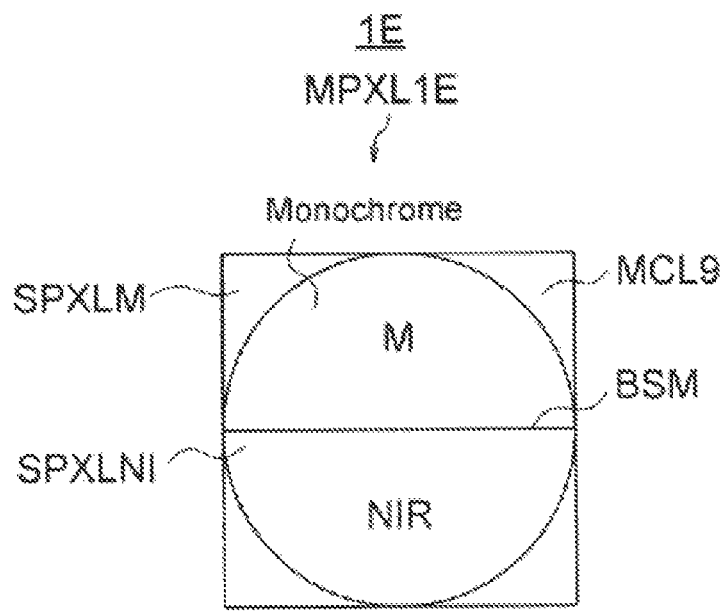

The solid-state imaging device 10I shown in FIG. 15 can be configured as an M-NIR sensor, like the solid-state imaging device of FIGS. 4A to 4C.

In the solid-state imaging device 10I relating to the seventh embodiment, the first and second sub-pixels SPXL11 and SPXL12 sharing the microlens MCL221I are partially capable of having PDAF information, and so are the third and fourth sub-pixels SPXL21 and SPXL22 sharing the microlens MCL222I. In the example shown in FIG. 15, the first sub-pixel SPXL11 can have information PDAF1, the second sub-pixel SPXL12 can have information PDAF2, the third sub-pixel SPXL21 can have information PDAF3, and the fourth sub-pixel SPXL22 can have information PDAF4.

Modification Example of Seventh Embodiment

Figure 16:
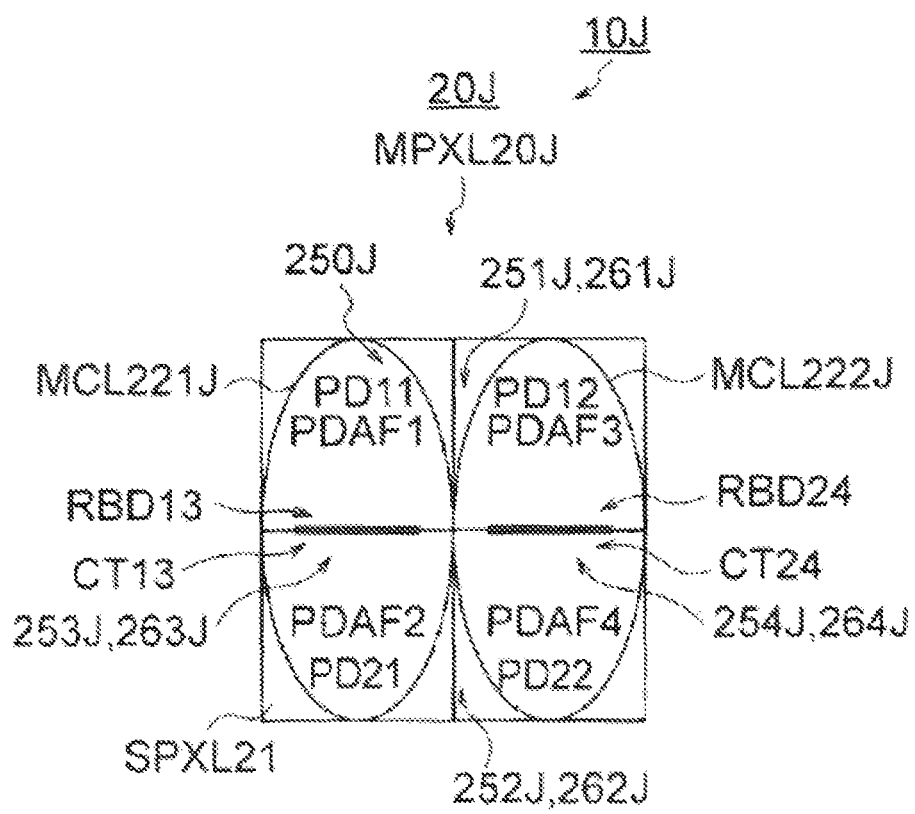
FIG. 16 schematically shows a modification example of the solid-state imaging device (the CMOS image sensor) according to the seventh embodiment of the present invention.

FIG. 16 schematically shows a modification example of the solid-state imaging device (the CMOS image sensor) according to the seventh embodiment of the present invention.

The modification example of FIG. 16 includes a first microlens MCL221J allowing light to enter the first photoelectric converting region PD11 of the first sub-pixel SPXL11 and the third photoelectric converting region PD21 of the third sub-pixel SPXL21, and a second microlens MCL222J allowing light to enter the second photoelectric converting region PD12 of the second sub-pixel SPXL12 and the fourth photoelectric converting region PD22 of the fourth sub-pixel SPXL22.

The optical center of the first microlens MCL221J is positioned in a center region CT13 of a boundary region RBD13 between the first photoelectric converting region PD11 of the first sub-pixel SPXL11 and the third photoelectric converting region PD21 of the third sub-pixel SPXL21. A low-reflection part is defined in the first separating part 253J of the first back side separating part 250J (and the first separating part 263C of the second back side separating part 260J), which is positioned in the boundary region RBD13. The low-reflection part is positioned in the center region CT13 of the boundary region RBD13, which includes the optical center, and made of a material that exhibits lower reflection (higher absorption) than the other region of the back side separating part outside the optical center region.

The optical center of the second microlens MCL12 is positioned in a center region CT24 of a boundary region RBD24 between the second photoelectric converting region PD12 of the second sub-pixel SPXL12 and the fourth photoelectric converting region PD22 of the fourth sub-pixel SPXL22. A low-reflection part is defined in the first separating part 254J of the first back side separating part 250J (and the first separating part 264J of the second back side separating part 260J), which is positioned in the boundary region RBD24. The low-reflection part is positioned in the center region CT24 of the boundary region RBD24, which includes the optical center, and made of a material that exhibits lower reflection (higher absorption) than the other region of the back side separating part outside the optical center region.

In the present modification example, first separating parts 251J and 261J without a low-reflection part are formed in the boundary region between the first photoelectric converting region PD11 of the first sub-pixel SPXL11 and the second photoelectric converting region PD12 of the second sub-pixel SPXL12. Second separating parts 252J and 262J without a low-reflection part are formed in the boundary region between the third photoelectric converting region PD21 of the third sub-pixel SPXL21 and the fourth photoelectric converting region PD22 of the fourth sub-pixel SPXL22. In the boundary region between the first photoelectric converting region PD11 of the first sub-pixel SPXL11 and the third photoelectric converting region PD21 of the third sub-pixel SPXL21, third separating parts 253J and 263J having a low-reflection part defined therein and positioned in the center region CT13 of the boundary region are formed. In the boundary region between the second photoelectric converting region PD12 of the second sub-pixel SPXL12 and the fourth photoelectric converting region PD22 of the fourth sub-pixel SPXL22, fourth separating parts 254J and 264J having a low-reflection part defined therein and positioned in the center region CT24 of the boundary region are formed.

In the present modification example, the first and third sub-pixels SPXL11 and SPXL21 sharing the microlens MCL221J are partially capable of having PDAF information, and so are the second and fourth sub-pixels SPXL12 and SPXL22 sharing the microlens MCL222J. In the example shown in FIG. 16, the first sub-pixel SPXL11 can have information PDAF1, the third sub-pixel SPXL21 can have information PDAF2, the second sub-pixel SPXL12 can have information PDAF3, and the fourth sub-pixel SPXL22 can have information PDAF4.

The seventh embodiment can produce the same effects as the above-described first and fourth embodiments, more specifically, produces little crosstalk between adjacent sub-pixels, can reduce the influence of the luminance shading, and can even prevent the degradation in the sensitivity at the optical center. Furthermore, the sub-pixels sharing a single microlens can provide for PDAF capability.

In the present embodiment, in the vicinity of the optical center of the multi-pixel in which at least one microlens is shared by sub-pixels, the back side separating part, the back side separating part and the trench-shaped back side separating part, or, if the back side separating part is removed, the trench-shaped back side separating part can be alternatively made of a low-reflection material.

The solid-state imaging devices 10, and 10A to 10J described above can be applied, as an imaging device, to electronic apparatuses such as digital cameras, video cameras, mobile terminals, surveillance cameras, and medical endoscope cameras.

Figure 17:
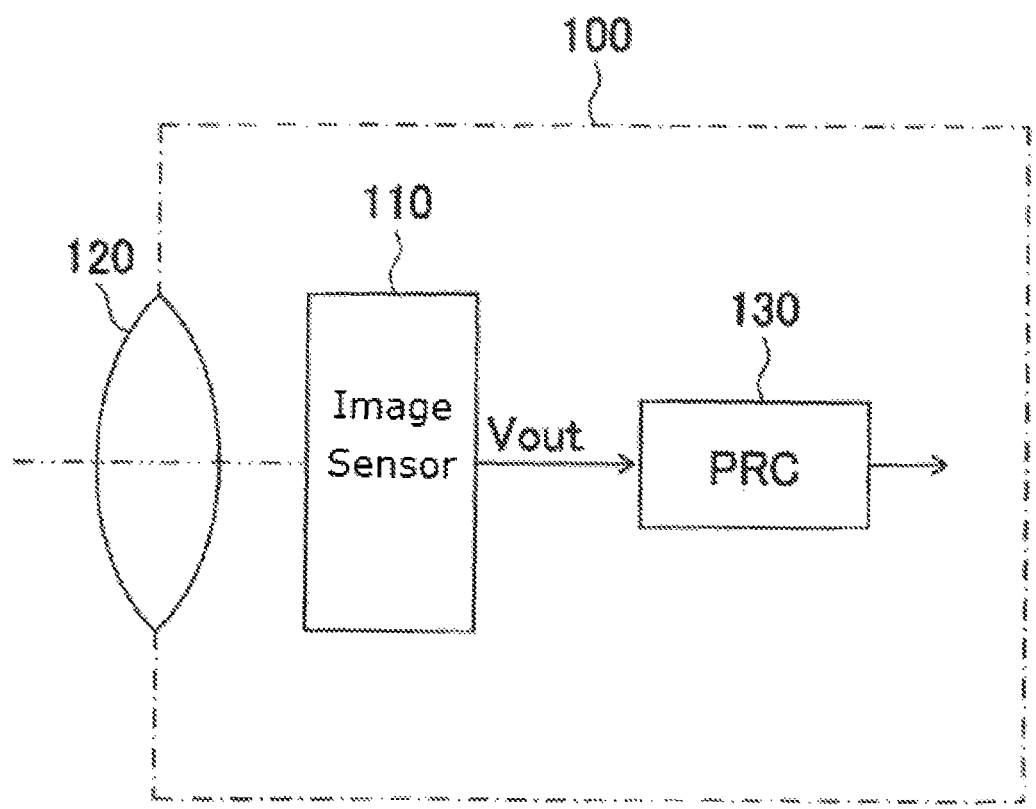
FIG. 17 shows an example configuration of an electronic apparatus to which the solid-state imaging devices relating to the embodiments of the present invention can be applied.

FIG. 17 shows an example configuration of an electronic apparatus including a camera system to which the solid-state imaging devices according to the embodiments of the present invention can be applied.

As shown in FIG. 17, the electronic apparatus 100 includes a CMOS image sensor 110 that can be constituted by the solid-state imaging devices 10, 10A to 10J relating to the embodiments of the present invention. The electronic apparatus 100 further includes an optical system (such as a lens) 120 for redirecting the incident light to the pixel region of the CMOS image sensor 110 (to form a subject image). The electronic apparatus 100 includes a signal processing circuit (PRC) 130 for processing the output signals from the CMOS image sensor 110.

The signal processing circuit 130 performs predetermined signal processing on the output signals from the CMOS image sensor 110. The image signals resulting from the processing in the signal processing circuit 130 can be handled in various manners. For example, the image signals can be displayed as a video image on a monitor having a liquid crystal display, printed by a printer, or recorded directly on a storage medium such as a memory card.

As described above, if the above-described solid-state imaging devices 10, 10A to 10G are mounted as the CMOS image sensor 110, the camera system can achieve high-performance, compactness, and low-cost. Accordingly, the embodiments of the present invention can provide for electronic apparatuses such as surveillance cameras and medical endoscope cameras, which are used for applications where the cameras are installed under restricted conditions from various perspectives such as the installation size, the number of connectable cables, the length of cables and the installation height.

What is claimed is:

1. A solid-state imaging device comprising:
   a multi-pixel including at least four sub-pixels, each sub-pixel having a photoelectric converting region, wherein the at least four sub-pixels comprise at least one green sub-pixel, at least one red sub-pixel, at least one blue sub-pixel, and at least one near-infrared sub-pixel;
   a back side separating part separating a plurality of adjacent sub-pixels from each other at least in a light entering portion of the photoelectric converting region thereof;
   a trench-shaped back side separating part formed in the photoelectric converting region, the trench-shaped back side separating part aligned with the back side separating part in a depth direction of the photoelectric converting region;
   an anti-reflective film formed between the back side separating part and the trench-shaped back side separating part; and
   a lens part allowing light to enter the photoelectric converting region of at least four of the plurality of adjacent sub-pixels, wherein:
      the lens part is arranged such that an optical center thereof is positioned at a location where the back side separating part is formed, and
      the back side separating part is formed such that at least an optical center region thereof exhibits low reflection.

2. The solid-state imaging device according to claim 1, wherein the back side separating part is formed such that the optical center region thereof exhibits lower reflection than the other region of the back side separating part.

3. The solid-state imaging device according to claim 1, wherein the back side separating part is formed such that the optical center region and the other region of the back side separating part exhibit low reflection.

4. The solid-state imaging device according to claim 1, wherein a low reflection part of the back side separating part exhibiting lower reflection is made of a material exhibiting low reflection within a specific wavelength range.

5. The solid-state imaging device according to claim 1, wherein, from the back side separating part, a material forming the back side separating part is removed so that the lower reflection is achieved.

6. The solid-state imaging device according to claim 1, wherein the trench-shaped back side separating part exhibits low reflection.

7. The solid-state imaging device according to claim 1, wherein, in a vicinity of an optical center of the multi-pixel in which at least one lens part is shared by sub-pixels, the back side separating part, the back side separating part and the trench-shaped back side separating part, or, if the back side separating part is removed, the trench-shaped back side separating part can be alternatively made of a low-reflection material.

8. The solid-state imaging device according to claim 1, wherein:
  in the multi-pixel, a first sub-pixel, a second sub-pixel, a third sub-pixel and a fourth sub-pixel are arranged in a square geometry such that, in a first direction, the first sub-pixel is adjacent to the second sub-pixel and the third sub-pixel is adjacent to the fourth sub-pixel and that, in a second direction orthogonal to the first direction, the first sub-pixel is adjacent to the third sub-pixel and the second sub-pixel is adjacent to the fourth sub-pixel,
  the lens part is formed by a single microlens allowing light to enter a first photoelectric converting region of the first sub-pixel, a second photoelectric converting region of the second sub-pixel, a third photoelectric converting region of the third sub-pixel and a fourth photoelectric converting region of the fourth sub-pixel, and
  an optical center of the single microlens is positioned in a pixel center region where a boundary of the first sub-pixel, a boundary of the second sub-pixel, a boundary of the third sub-pixel and a boundary of the fourth sub-pixel meet each other.

9. The solid-state imaging device according to claim 1, wherein, in the multi-pixel, a first sub-pixel, a second sub-pixel, a third sub-pixel and a fourth sub-pixel are arranged in a square geometry such that, in a first direction, the first sub-pixel is adjacent to the second sub-pixel and the third sub-pixel is adjacent to the fourth sub-pixel and that, in a second direction orthogonal to the first direction, the first sub-pixel is adjacent to the third sub-pixel and the second sub-pixel is adjacent to the fourth sub-pixel, and
  wherein the lens part includes:
    a first microlens allowing light to enter a first photoelectric converting region of the first sub-pixel and a second photoelectric converting region of the second sub-pixel;
    a second microlens allowing light to enter a third photoelectric converting region of the third sub-pixel; and
    a third microlens allowing light to enter a fourth photoelectric converting region of the fourth sub-pixel, and
    the lens part is structured such that an optical center of the first microlens is positioned at least in a center region of a boundary region between the first photoelectric converting region of the first sub-pixel and the second photoelectric converting region of the second sub-pixel, or
  wherein the lens part includes:
    a first microlens allowing light to enter a first photoelectric converting region of the first sub-pixel and a third photoelectric converting region of the third sub-pixel;
    a second microlens allowing light to enter a second photoelectric converting region of the second sub-pixel; and
    a third microlens allowing light to enter a fourth photoelectric converting region of the fourth sub-pixel, and
    the lens part is structured such that an optical center of the first microlens is positioned at least in a center region of a boundary region between the first photoelectric converting region of the first sub-pixel and the third photoelectric converting region of the third sub-pixel, or
  wherein the lens part includes:
    a first microlens allowing light to enter a third photoelectric converting region of the third sub-pixel and a fourth photoelectric converting region of the fourth sub-pixel;
    a second microlens allowing light to enter a first photoelectric converting region of the first sub-pixel; and
    a third microlens allowing light to enter a second photoelectric converting region of the second sub-pixel, and
    the lens part is structured such that an optical center of the first microlens is positioned at least in a center region of a boundary region between the third photoelectric converting region of the third sub-pixel and the fourth photoelectric converting region of the fourth sub-pixel, or
  wherein the lens part includes:
    a first microlens allowing light to enter a second photoelectric converting region of the second sub-pixel and a fourth photoelectric converting region of the fourth sub-pixel;
    a second microlens allowing light to enter a first photoelectric converting region of the first sub-pixel; and
    a third microlens allowing light to enter a third photoelectric converting region of the third sub-pixel, and
    the lens part is structured such that an optical center of the first microlens is positioned at least in a center region of a boundary region between the second photoelectric converting region of the second sub-pixel and the fourth photoelectric converting region of the fourth sub-pixel.

10. The solid-state imaging device according to claim 1, wherein, in the multi-pixel, a first sub-pixel, a second sub-pixel, a third sub-pixel and a fourth sub-pixel are arranged in a square geometry such that, in a first direction, the first sub-pixel is adjacent to the second sub-pixel and the third sub-pixel is adjacent to the fourth sub-pixel and that, in a second direction orthogonal to the first direction, the first sub-pixel is adjacent to the third sub-pixel and the second sub-pixel is adjacent to the fourth sub-pixel, and wherein the lens part includes:
- a first microlens allowing light to enter a first photoelectric converting region of the first sub-pixel and a second photoelectric converting region of the second sub-pixel; and
- a second microlens allowing light to enter a third photoelectric converting region of the third sub-pixel and a fourth photoelectric converting region of the fourth sub-pixel, and
- the lens part is structured such that an optical center of the first microlens is positioned at least in a center region of a boundary region between the first photoelectric converting region of the first sub-pixel and the second photoelectric converting region of the second sub-pixel and such that an optical center of the second microlens is positioned at least in a center region of a boundary region between the third photoelectric converting region of the third sub-pixel and the fourth photoelectric converting region of the fourth sub-pixel, or wherein the lens part includes:
- a first microlens allowing light to enter a first photoelectric converting region of the first sub-pixel and a third photoelectric converting region of the third sub-pixel; and
- a second microlens allowing light to enter a second photoelectric converting region of the second sub-pixel and a fourth photoelectric converting region of the fourth sub-pixel, and
- the lens part is structured such that an optical center of the first microlens is positioned at least in a center region of a boundary region between the first photoelectric converting region of the first sub-pixel and the third photoelectric converting region of the third sub-pixel and such that an optical center of the second microlens is positioned at least in a center region of a boundary region between the second photoelectric converting region of the second sub-pixel and the fourth photoelectric converting region of the fourth sub-pixel.

11. A method for manufacturing a solid-state imaging device, the method comprising:
- obtaining a multi-pixel having at least four sub-pixels, each sub-pixel having a photoelectric converting region, wherein the at least four sub-pixels comprise at least one green sub-pixel, at least one red sub-pixel, at least one blue sub-pixel, and at least one near-infrared sub-pixel, the multi-pixel having:
  - a back side separating part separating a plurality of adjacent sub-pixels from each other at least in a light entering portion of the photoelectric converting region thereof;
  - a trench-shaped back side separating part formed in the photoelectric converting region, the trench-shaped back side separating part aligned with the back side separating part in a depth direction of the photoelectric converting region;
  - an anti-reflective film formed between the back side separating part and the trench-shaped back side separating part; and
- obtaining a lens part allowing light to enter the photoelectric converting region of at least four of the plurality of adjacent sub-pixels, wherein an optical center of the lens part is positioned at a location where the back side separating part is formed, and wherein the back side separating part is formed such that at least an optical center region thereof exhibits low reflection; and
- forming a solid-state imaging device using the multi-pixel and the lens part.

12. An electronic apparatus comprising:
- a solid-state imaging device; and
- an optical system for forming a subject image on the solid-state imaging device,
- wherein the solid-state imaging device includes
  - a multi-pixel having at least four sub-pixels, each sub-pixel having a photoelectric converting region, wherein the at least four sub-pixels comprise at least one green sub-pixel, at least one red sub-pixel, at least one blue sub-pixel, and at least one near-infrared sub-pixel,
  - wherein the multi-pixel has:
    - a back side separating part separating a plurality of adjacent sub-pixels from each other at least in a light entering portion of the photoelectric converting region;
    - a trench-shaped back side separating part formed in the photoelectric converting region, the trench-shaped back side separating part aligned with the back side separating part in a depth direction of the photoelectric converting region;
    - an anti-reflective film formed between the back side separating part and the trench-shaped back side separating part; and
    - a lens part allowing light to enter the photoelectric converting region of at least four of the plurality of adjacent sub-pixels,
  - wherein the lens part is arranged such that an optical center thereof is positioned at a location where the back side separating part is formed, and
  - wherein the back side separating part is formed such that at least an optical center region thereof exhibits low reflection.

* * * * *